United States Patent
Spector et al.

(10) Patent No.: US 10,684,420 B2
(45) Date of Patent: Jun. 16, 2020

(54) INTEGRATED MEMS SWITCHES FOR SELECTIVELY COUPLING LIGHT IN AND OUT OF A WAVEGUIDE

(71) Applicant: The Charles Stark Draper Laboratory, Inc., Cambridge, MA (US)

(72) Inventors: Steven J. Spector, Lexington, MA (US); Michael G. Moebius, Somerville, MA (US); Benjamin F. Lane, Sherborn, MA (US); Gregg E. Favalora, Bedford, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 16/597,595

(22) Filed: Oct. 9, 2019

(65) Prior Publication Data
US 2020/0041728 A1    Feb. 6, 2020

Related U.S. Application Data

(62) Division of application No. 15/844,527, filed on Dec. 16, 2017, now Pat. No. 10,473,862.
(Continued)

(51) Int. Cl.
*G02B 6/35*      (2006.01)
*H04Q 11/00*    (2006.01)
(Continued)

(52) U.S. Cl.
CPC .......... *G02B 6/3548* (2013.01); *B81B 3/0083* (2013.01); *G01S 7/4814* (2013.01);
(Continued)

(58) Field of Classification Search
CPC ............... G02B 6/3548; G02B 26/007; G02B 2006/12145; G02B 6/3534; G02B 6/354;
(Continued)

(56) References Cited

U.S. PATENT DOCUMENTS

| 4,013,000 A | 3/1977 | Kogelnik |
| 5,059,008 A | 10/1991 | Flood et al. |

(Continued)

FOREIGN PATENT DOCUMENTS

| WO | WO 03/098263 A2 | 11/2003 |
| WO | WO 2008/045126 A2 | 4/2008 |

OTHER PUBLICATIONS

Chun, et al., "Spatial 3-D Infrastructure: Display-Independent Software Framework, High-Speed Rendering Electronics, and Several New Displays," appeared in Stereoscopic Displays and Virtual Reality Systems XII, Proceedings of SPIE-IS&T Electronic Imaging, SPIE vol. 5664, pp. 302-312, 2005.
(Continued)

*Primary Examiner* — Leslie C Pascal
(74) *Attorney, Agent, or Firm* — Sunstein LLP

(57) ABSTRACT

A steerable optical transmit and receive terminal includes a MEMS-based N×1 optical switch network. Each optical switch in the optical switch network uses an electrostatic MEMS structure to selectively position a translatable optical grating close to or far from an optical waveguide. In the close ("ON") position, light couples between the translatable optical grating and the optical waveguide, whereas in the far ("OFF") position, no appreciable light couples between the translatable optical grating and the optical waveguide. The translatable optical grating is disposed at or near a surface of the optical switch network. Thus, the translatable optical grating emits light into, or receives light from, free space. The steerable optical transmit and receive terminal also includes a lens and can steer a free space optical beam in a direction determined by which port of the N×1 optical switch network is ON.

19 Claims, 20 Drawing Sheets

Related U.S. Application Data

(60) Provisional application No. 62/498,158, filed on Dec. 16, 2016, provisional application No. 62/450,855, filed on Jan. 26, 2017, provisional application No. 62/516,602, filed on Jun. 7, 2017.

(51) Int. Cl.

| | |
|---|---|
| *G01S 7/481* | (2006.01) |
| *B81B 3/00* | (2006.01) |
| *G01S 17/89* | (2020.01) |
| *G02B 26/00* | (2006.01) |
| *H04J 14/02* | (2006.01) |
| *G02B 6/12* | (2006.01) |

(52) U.S. Cl.
CPC .......... *G01S 7/4816* (2013.01); *G01S 7/4817* (2013.01); *G01S 17/89* (2013.01); *G02B 6/354* (2013.01); *G02B 6/355* (2013.01); *G02B 6/3526* (2013.01); *G02B 6/3534* (2013.01); *G02B 26/007* (2013.01); *H04J 14/022* (2013.01); *H04Q 11/0003* (2013.01); *H04Q 11/0005* (2013.01); *B81B 2201/045* (2013.01); *G02B 2006/12145* (2013.01)

(58) Field of Classification Search
CPC .. G02B 6/3526; G02B 6/355; H04Q 11/0003; H04Q 11/0005; G01S 7/4816; G01S 7/4817; G01S 7/4814; G01S 17/89; H04J 14/022; B81B 2201/045; B81B 3/0083
See application file for complete search history.

(56) References Cited

U.S. PATENT DOCUMENTS

| | | | |
|---|---|---|---|
| 5,392,157 A | 2/1995 | Shih | |
| 5,943,159 A | 8/1999 | Zhu | |
| 6,927,886 B2 | 8/2005 | Plesniak et al. | |
| 7,298,555 B2 | 11/2007 | Capps | |
| 7,864,419 B2 | 1/2011 | Cossairt et al. | |
| 2002/0048423 A1 | 4/2002 | Frick et al. | |
| 2003/0107798 A1* | 6/2003 | Zhang | A61K 31/40 359/326 |
| 2009/0034042 A1 | 2/2009 | Tholl et al. | |
| 2013/0027715 A1 | 1/2013 | Imaki et al. | |
| 2016/0327751 A1 | 11/2016 | Wu et al. | |

OTHER PUBLICATIONS

Geng, "Three-dimensional display technologies," Advances in Optics and Photonics 5, pp. 456-535, 2013.

Halle, "Holographic stereograms as discrete imaging systems," SPIE Proceeding #2176 "Practical Holography VIII", 12 pages, Feb. 1994.

Holliman, et al., "Three-Dimensional Displays: A Review and Applications Analysis," IEEE Transactions on Broadcasting, vol. 57, No. 2, pp. 362-371, Jun. 2011.

International Searching Authority, European Patent Office, International Search Report and Written Opinion, International Application No. PCT/US2017/000095, 15 pages, dated Mar. 27, 2018.

International Searching Authority, European Patent Office, Invitation to Pay Additional Fees, International Application No. PCT/US2017/066885, 13 pages, dated Mar. 19, 2018.

International Searching Authority, European Patent Office, International Search Report and Written Opinion, International Application No. PCT/US2017/066885, 19 pages, dated May 14, 2018.

Seok, et al., "Large-scale broadband digital silicon photonic switches with vertical adiabatic couplers: supplementary material," Optica, vol. 3, No. 1, pp. 64-70, Jan. 2016.

Seok, et al., "Large-scale broadband digital silicon photonic switches with vertical adiabatic couplers: supplementary material," Optica, 5 pages, Jan. 13, 2016.

Smithwick, et al., "Interactive Holographic Stereograms with Accommodation Cues," Practical Holography XXIV: Materials and Applications, SPIE, 13 pages, 2010.

Vivien, et al., "Experimental demonstration of a low-loss optical H-tree distribution using silicon-on-insulator microwaveguides," Applied Physics Letters, vol. 85, No. 5, 3 pages, Aug. 2, 2004.

* cited by examiner

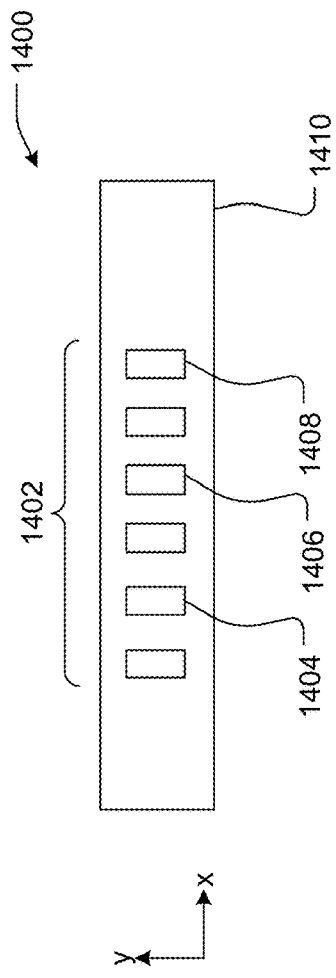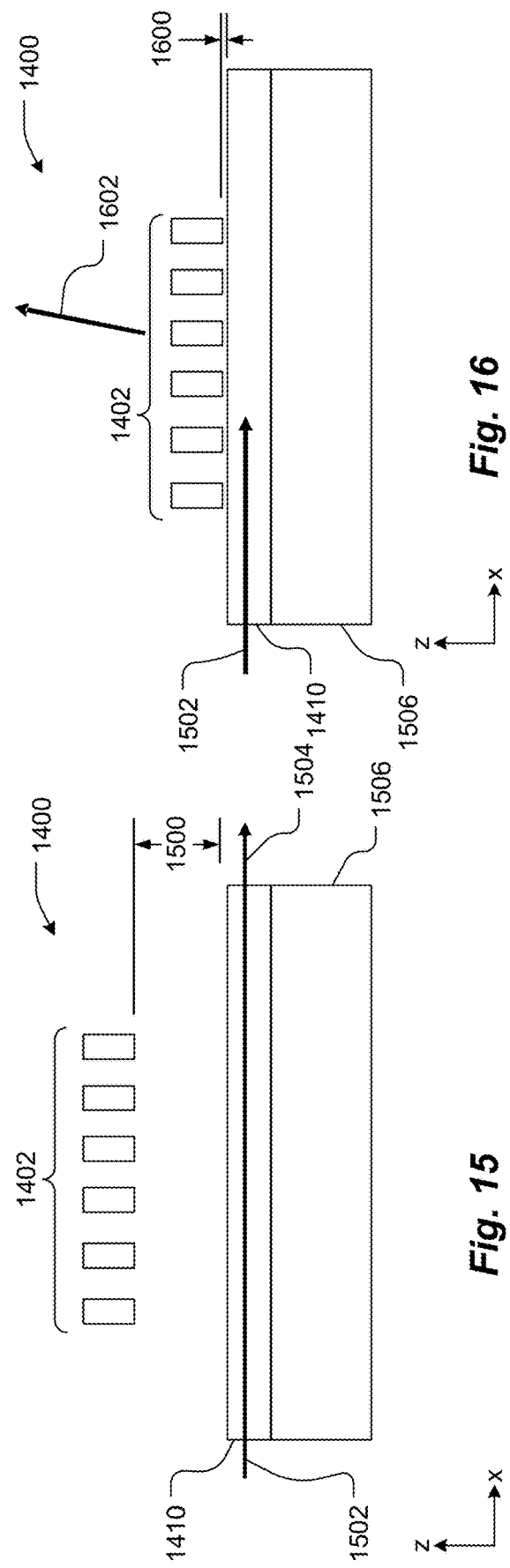

INTEGRATED MEMS SWITCHES FOR SELECTIVELY COUPLING LIGHT IN AND OUT OF A WAVEGUIDE

CROSS REFERENCE TO RELATED APPLICATIONS

This application is a divisional of U.S. patent application Ser. No. 15/844,527, filed Dec. 16, 2017, titled "Integrated MEMS Switches for Selectively Coupling Light In and Out of a Waveguide," which claims the benefit of U.S. Provisional Patent Application No. 62/498,158, filed Dec. 16, 2016, titled "All-solid state optical transmit/receive terminal," U.S. Provisional Patent Application No. 62/450,855, filed Jan. 26, 2017, titled "Method and Apparatus for Light Field Generation" and U.S. Provisional Patent Application No. 62/516,602, filed Jun. 7, 2017, titled "Integrated MEMS Switches for Selectively Coupling Light In and Out of a Waveguide," the entire contents of each of which are hereby incorporated by reference herein, for all purposes.

TECHNICAL FIELD

The present invention relates to optical switches and, more particularly, to optical switch networks used to control directions in which optical signals are transmitted or received, such as in light direction and ranging (LiDAR) and laser communication systems.

BACKGROUND ART

Many optical system need to emit or receive a (humanly visible or invisible) collimated optical beam in a direction that can be controlled with high precision. For example, such optical beams are used in light direction and ranging (LiDAR) systems, and often these beams need to be steered or swept to locate or track a target. Similarly, laser communications systems sometimes need to steer an optical beam, such as to initially establish a line-of-sight communications channel between two terminals or if one or both of the terminals moves.

Prior art LiDAR and laser communications terminals use telescopes and either point the entire telescope using a gimbal or place a moveable steering mirror in front of the telescope and use the mirror to redirect the beam, as exemplified by U.S. Pat. Publ. No. 2007/0229994. However, this approach requires large and bulky moving systems, with attendant disadvantages in terms of size, mass, power and reliability.

Other conventional methods of beam steering involve optical phased arrays, in which a large number of antennas are arrayed closely together and operated coherently, i.e., the phases of the individual emitters are carefully controlled to make the entire array operate in unison. Signals in the near field constructively and destructively interfere to create nulls and reinforced signals in desired directions. However, phased arrays require large numbers of emitters and associated optical phase adjusters.

A nominal optical phased array has emitters disposed at half-wavelength spacings, i.e. apx. 0.5 µm. For applications, such as long-range laser communication, the required total aperture size might be on the order of 5 cm. Thus, one would need an array of $10^4 \times 10^4$ emitters and phase shifters. As currently demonstrated, phase shifters requires apx. 1 mW of power to operate. Thus, the total power consumption of such an array might approach $10^5$ W, an impractically large amount of power. However, limitations on the densities at which binary optical switches may be fabricated limit spatial resolution of the transmit/receive terminal, i.e., density of possible transmit or receive beam positions.

SUMMARY OF EMBODIMENTS

An embodiment of the present invention provides an optical switch network. The optical switch network include a common input/output port, a waveguide having a length and being optically coupled to the common input/output port, and a plurality of binary optical switches disposed on a planar surface. The plurality of binary optical switch is disposed along the length of the waveguide. Each binary optical switch of the plurality of binary optical switches includes a translatable optical grating and a MEMS structure. The translatable optical grating is configured to translate between at least two positions. T first position of the at least two positions is sufficiently close to the waveguide to optically couple between the waveguide and free space beyond the planar surface with a coupling efficiency of at least about 25%, and a second position of the at least two positions is sufficiently far from the waveguide to optically couple between the waveguide and the free space with a coupling efficiency of at most about 5%. The MEMS structure is configured to selectively translate the translatable optical grating to the first position and to the second position.

Another embodiment of the present invention provides an optical switch network. The optical switch network includes a common input/output port, a plurality of N other ports, a first waveguide optically coupled to the common input/output port, and a plurality of first binary optical switches optically coupled to the first waveguide. The plurality of first binary optical switches is disposed along the length of the first waveguide. The optical switch network also includes a plurality of second waveguides. Each second waveguide of the plurality of second waveguides is optically coupled to the first waveguide via a respective first binary optical switch of the plurality of first binary optical switches. For each second waveguide of the plurality of second waveguides, a respective plurality of second binary optical switches is optically coupled to the second waveguide of the plurality of second waveguides. Each plurality of second binary optical switches is disposed along the length of the respective second waveguide. Each second binary optical switch of the plurality of second binary optical switches is optically coupled between the respective second waveguide of the plurality of second waveguides and a respective port of the plurality of N other ports. Each second binary optical switch of the plurality of second binary optical switches includes a translatable optical grating and a MEMS structure. The translatable optical grating is configured to translate between at least two positions, a first position of the at least two positions being sufficiently close to the respective second waveguide to optically couple with the second waveguide with a coupling efficiency of at least about 25%, and a second position of the at least two positions being sufficiently far from the respective second waveguide to optically couple with the second waveguide with a coupling efficiency of at most about 5%. The MEMS structure is configured to selectively translate the translatable optical grating to the first position and to the second position.

The N other ports may be arranged in a rectangular array.

The N other ports may be disposed on a planar surface.

Each second binary optical switch of the plurality of second binary optical switches may be configured, when the second binary optical switch is in the first position, to optically couple between the respective second waveguide and free space beyond the planar surface.

The optical switch network may include or be fabricated on a photonic chip.

Each port of the N other ports may include an optical coupler.

The optical switch network may also include a row-and-column addressing matrix having a plurality of rows and a plurality of columns. Each first binary optical switch of the plurality of first binary optical switches and each second binary optical switch of the plurality of second binary optical switches may be coupled to a row of the plurality of rows, coupled to a column of the plurality of columns, and configured to actuate in response to signals being present on both the row of the plurality of rows and the column of the plurality of columns.

Yet another embodiment of the present invention provides an optical send/receive terminal. The optical send/receive terminal includes a lens having a field of view. The optical send/receive terminal also includes an optical switch network. The optical switch network includes a common input/output port, a plurality of N other ports optically coupled to the lens, such that each port of the plurality of N other ports is optically coupled to a unique portion of the lens field of view. The optical switch network also includes a first waveguide optically coupled to the common input/output port and a plurality of first binary optical switches optically coupled to the first waveguide. The plurality of first binary optical switches is disposed along the length of the first waveguide. The optical switch network also includes a plurality of second waveguides. Each second waveguide of the plurality of second waveguides is optically coupled to the first waveguide via a respective first binary optical switch of the plurality of first binary optical switches. For each second waveguide of the plurality of second waveguides, a respective plurality of second binary optical switches is optically coupled to the second waveguide of the plurality of second waveguides. Each plurality of second binary optical switches is disposed along the length of the respective second waveguide. Each second binary optical switch of the plurality of second binary optical switches is optically coupled between the respective second waveguide of the plurality of second waveguides and a respective port of the plurality of N other ports. Each second binary optical switch of the plurality of second binary optical switches includes a translatable optical grating and a MEMS structure. The translatable optical grating is configured to translate between at least two positions, a first position of the at least two positions being sufficiently close to the respective second waveguide to optically couple with the second waveguide with a coupling efficiency of at least about 25%, and a second position of the at least two positions being sufficiently far from the respective second waveguide to optically couple with the second waveguide with a coupling efficiency of at most about 5%. The MEMS structure is configured to selectively translate the translatable optical grating to the first position and to the second position. An optical transmitter and/or an optical receiver is optically coupled to the common input/output port of the optical switch network.

The optical send/receive terminal may also include a plurality of optical fibers optically coupling the N other ports to the lens.

The optical switch network may define a surface and each second binary optical switch of the plurality of second binary optical switches may be configured, when the second binary optical switch is in the first position, to optically couple between the respective second waveguide and free space beyond the surface of the optical switch network.

Each translatable optical grating may include a respective MEMS structure.

Each first binary optical switch of the plurality of first binary optical switches may include a respective MEMS structure.

The optical send/receive terminal may also include a row-and-column addressing matrix having a plurality of rows and a plurality of columns. Each first binary optical switch of the plurality of first binary optical switches and each second binary optical switch of the plurality of second binary optical switches may be coupled to a row of the plurality of rows, coupled to a column of the plurality of columns, and configured to actuate in response to signals being present on both the row of the plurality of rows and the column of the plurality of columns.

An embodiment of the present invention provides an optical terminal. The optical terminal includes a lens having a field of view and a planar optical switch that includes a plurality of optical switch arrays. Each optical switch array of the plurality of optical switch arrays may include a common port and a plurality of N other ports optically coupled to the lens. Each port of the plurality of N other ports is optically coupled to a unique portion of the lens field of view. A planar N×1 optical switch network optically is coupled between the common port and the plurality of N other ports. An optical receiver optically coupled to the common port.

Each optical switch array of the plurality of optical switch arrays may also include an optical transmitter optically coupled to the common port.

The optical terminal may also include an optical transmitter optically coupled to the common port of at least one optical switch array of the plurality of optical switch arrays.

The optical terminal may also include an optical transmitter optically coupled to the common ports of the plurality of optical switch arrays.

The planar optical switch may define a plane. For each optical switch array of the plurality of optical switch arrays, the planar N×1 optical switch network may include a waveguide having a length and being optically coupled to the common port of the optical switch array. A plurality of binary optical switches may be disposed on the plane of the planar optical switch. The plurality of binary optical switches may be disposed along the length of the waveguide. Each binary optical switch of the plurality of binary optical switches may include a translatable optical grating and a MEMS structure. The translatable optical grating may be configured to translate between at least two positions, a first position of the at least two positions being sufficiently close to the waveguide to optically couple between the waveguide and free space beyond the plane of the planar optical switch with a coupling efficiency of at least about 25%, and a second position of the at least two positions being sufficiently far from the waveguide to optically couple between the waveguide and the free space with a coupling efficiency of at most about 5%. The MEMS structure may be configured to selectively translate the translatable optical grating to the first position and to the second position.

Another embodiment of the present invention provides an optical terminal that includes a lens having a field of view. A planar optical switch defines a planar surface and includes a plurality of optical switch arrays. Each optical switch array of the plurality of optical switch arrays includes a common port, a waveguide having a length and being optically coupled to the common port. A plurality of binary optical switches is disposed on the planar surface. The plurality of binary optical switches is disposed along the length of the waveguide. Each binary optical switch of the plurality of binary optical switches includes a translatable optical grating and a MEMS structure. The translatable optical grating is configured to translate between at least two positions, a first position of the at least two positions being sufficiently close to the waveguide to optically couple between the waveguide and free space beyond the planar surface with a coupling efficiency of at least about 25%, and a second position of the at least two positions being sufficiently far from the waveguide to optically couple between the waveguide and the free space with a coupling efficiency of at most about 5%. The MEMS structure is configured to selectively translate the translatable optical grating to the first position and to the second position.

Yet another embodiment of the present invention provides an optical system that includes a lenticular lens having a field of view and a plurality of ports. The plurality of ports is disposed such that, for each port of the plurality of ports, a unique portion of the field of view is visible, through the lenticular lens, by the port. An optical switch network has an input port and is configured to optically couple the input port to a selected port of the plurality of ports in response to a control signal.

The optical switch network may define a planar surface. The optical switch network may include a waveguide having a length and being optically coupled to the input port. A plurality of binary optical switches may be disposed on a planar surface. The plurality of binary optical switch may be disposed along the length of the waveguide. Each binary optical switch of the plurality of binary optical switches may include a translatable optical grating and a MEMS structure. The translatable optical grating may be configured to translate between at least two positions, a first position of the at least two positions being sufficiently close to the waveguide to optically couple between the waveguide and free space beyond the planar surface with a coupling efficiency of at least about 25%, and a second position of the at least two positions being sufficiently far from the waveguide to optically couple between the waveguide and the free space with a coupling efficiency of at most about 5%. The MEMS structure may be configured to selectively translate the translatable optical grating to the first position and to the second position.

The optical switch network may include a wavelength filter and a wavelength tunable light source.

An embodiment of the present invention provides a radiation projector that includes a lenticular lens. An input is configured to receive a time-varying illumination pattern. A nanophotonic array has a plurality of outputs. A filter is configured to direct the time-varying illumination pattern to a particular output of the nanophotonic array, so that the time-varying illumination from the output is directed to the lenticular lens.

BRIEF DESCRIPTION OF THE SEVERAL VIEWS OF THE DRAWING

The invention will be more fully understood by referring to the following Detailed Description of Specific Embodiments in conjunction with the Drawings, of which:

FIG. 14 is a schematic top view of a binary optical switch of the optical switch network of FIG. 12, according to an embodiment of the present invention.

FIG. 15 is a schematic side view of the binary optical switch of FIG. 14 in the OFF position, and FIG. 16 is a schematic side view of the binary optical switch of FIGS. 14 and 15 in the ON position, according to an embodiment of the present invention.

DETAILED DESCRIPTION OF SPECIFIC EMBODIMENTS

In accordance with embodiments of the present invention, methods and apparatus are disclosed for a steerable optical transmit and receive terminal and an associated MEMS-based optical switch network. Such a terminal does not require a phased array of emitters/collectors, nor the attendant large number of phase shifters. The optical switch network employs MEMS-based binary optical switches to steer the optical beam. However, the MEMS-based binary optical switches are significantly smaller than in the prior art, such as in H-tree based optical switch networks. Consequently, the MEMS-based binary optical switches may be fabricated or packed at a higher density than in the prior art, providing higher spatial resolution of the transmit/receive terminal, i.e., density of possible transmit/receive beam positions. A relatively small subset of the MEMS-based binary optical switches needs to be operated, therefore powered, at any given time. Therefore, the terminal overcomes the mechanical, switch density, emitter density and high power problems associated with the prior art.

Figure 1:
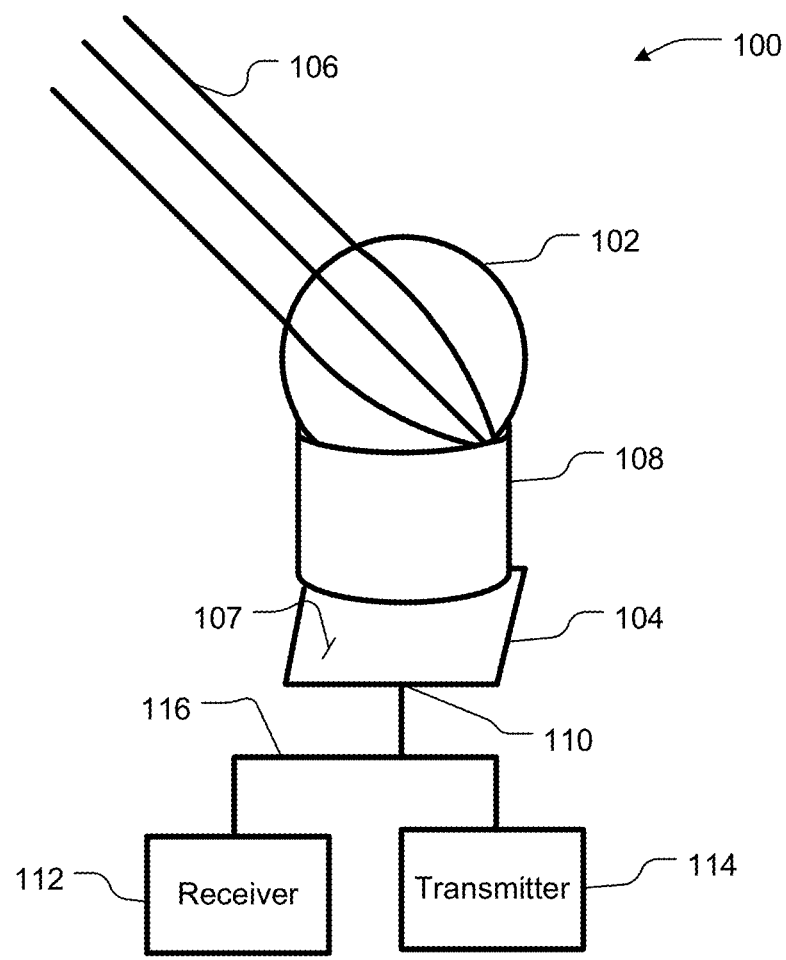
FIG. 1 is a schematic illustration of an all-solid state optical transmit/receive terminal, according to an embodiment of the present invention.

FIG. 1 is a schematic illustration of an all-solid state optical transmit/receive terminal 100, according to an embodiment of the present invention. A lens 102 is optically coupled to an optical switch network 104 (also referred to herein as an "optical waveguide network" or an "optical switch"), such that incoming light rays, represented by light rays 106, are focused on a surface 107 of the optical switch network 104. Conversely, optical signals emitted at the surface 107 of the optical switch network 104 are optically coupled to the lens and, thereby, projected into space as light rays 106. The light may be humanly visible or invisible, such as infrared (IR), light. The surface 107 may be a planar surface or a non-planar surface.

The lens 102 is preferably a wide field-of-view lens. The lens 102 may, for example, be a gradient index (GRIN) lens, fisheye lens or monocentric lens. A suitable monocentric lens is available from Distant Focus Corporation, PO Box 7857, Champaign, Ill. 61826-7857. If the lens creates a planar focused image, the lens 102 and the optical switch network 104 may be optically coupled by air or a vacuum 108. However, if the lens creates a curved focused image, a bundle of optical fibers 108 may be used to optically couple the lens 102 to the optical switch network 104. One end of each optical fiber of the bundle of optical fibers 108 may terminate on the surface of the lens 102, and the other end of the optical fiber may terminate on the surface 107 of the optical switch network 104. The ends of the optical fibers 108 that terminate on the surface of the lens 102 may have polished ends, forming curved surfaces that match curvature of the lens 102.

Figure 2:
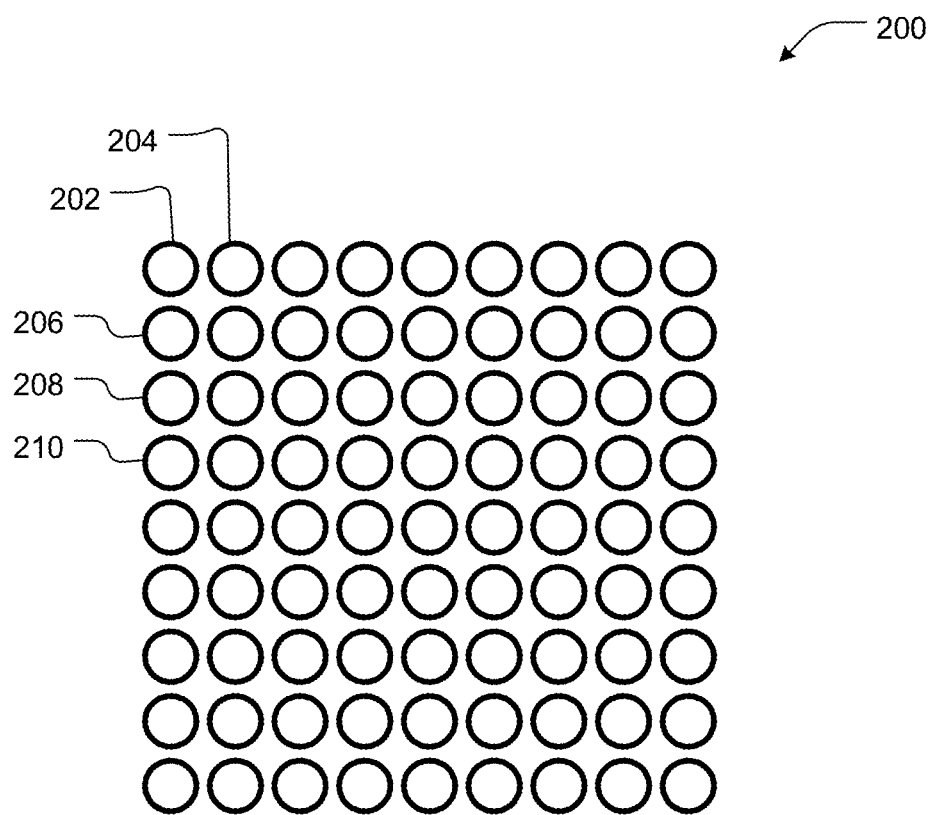
FIG. 2 is a schematic diagram illustrating a plurality of ports on a surface of an optical switch network of the all-solid state optical transmit/receive terminal of FIG. 1, according to an embodiment of the present invention.

FIG. 2 is a schematic diagram illustrating a plurality of N ports 200, represented by ports 202, 204, 206, 208 and 210, on the surface 107 of the optical switch network 104 of FIG. 1. The plurality of ports 200 is shown as being arranged in a rectangular array. However, the ports 200 may be arranged in any suitable arrangement. If optical fibers 108 (FIG. 1) are used to couple the lens 102 to the optical switch network 104, one or more optical fibers 108 may terminate at each port 202-210. The optical fibers 108 should be arranged so the image projected by the lens 102 is mapped to corresponding locations within the plurality of ports 200. Thus, each port 202-210 corresponds to a unique portion of the field of view of the lens 102.

Returning to FIG. 1, the optical switch network 104 also has a single common input/output port 110. The optical switch network 104 is configured to selectively optically couple one or more of the N ports 202-210 (FIG. 2) on the surface 107 to the common input/output port 110. Thus, in one mode, the optical switch network 104 acts as an N×1 switch. That is, one of the N ports 202-210 is coupled to the common input/output port 110. Optionally, in other modes, the optical switch network 104 acts as a plurality of N×1 switches. That is, a plurality of the N ports 202-210 are simultaneously coupled to the common input/output port 110.

The terminal 100 also includes a suitable optical receiver 112, such as a photo diode, and/or a suitable transmitter 114, such as a laser. A LiDAR system or a two-way communication system includes both the transmitter 114 and the receiver 112. However, a one-way communication system need to include only the transmitter 114 or the receiver 112, and a star tracker needs to include only the receiver 112. The receiver 112 and/or transmitter 114 are optically coupled to the common input/output port 110 by suitable optical couplings, represented by optical coupling 116, such as optical fibers, mirrors and/or splitters/combiners.

Thus, an optical signal from the transmitter 114 may be routed via the optical coupling 116 to the optical switch network 104 and there switched to a selected one or more of the N ports 202-210. Once emitted from the surface 107 of the optical switch 107, the optical signal is conveyed to the lens 102, such as via the optical fiber(s) 108 terminated at the selected port(s) 202-210, and then by the lens 102 into space. A direction in space, in which the optical signal is projected by the lens 102, depends on which port(s) 202-210 is(are) selected. Conversely, an optical signal received by the lens 102, such as a return signal in a LiDAR system, is routed by the optical switch network 104 to the receiver 112. A direction in space, from which the optical signal is received by the lens 102, depends on which port 202-210 is selected.

Figure 3:
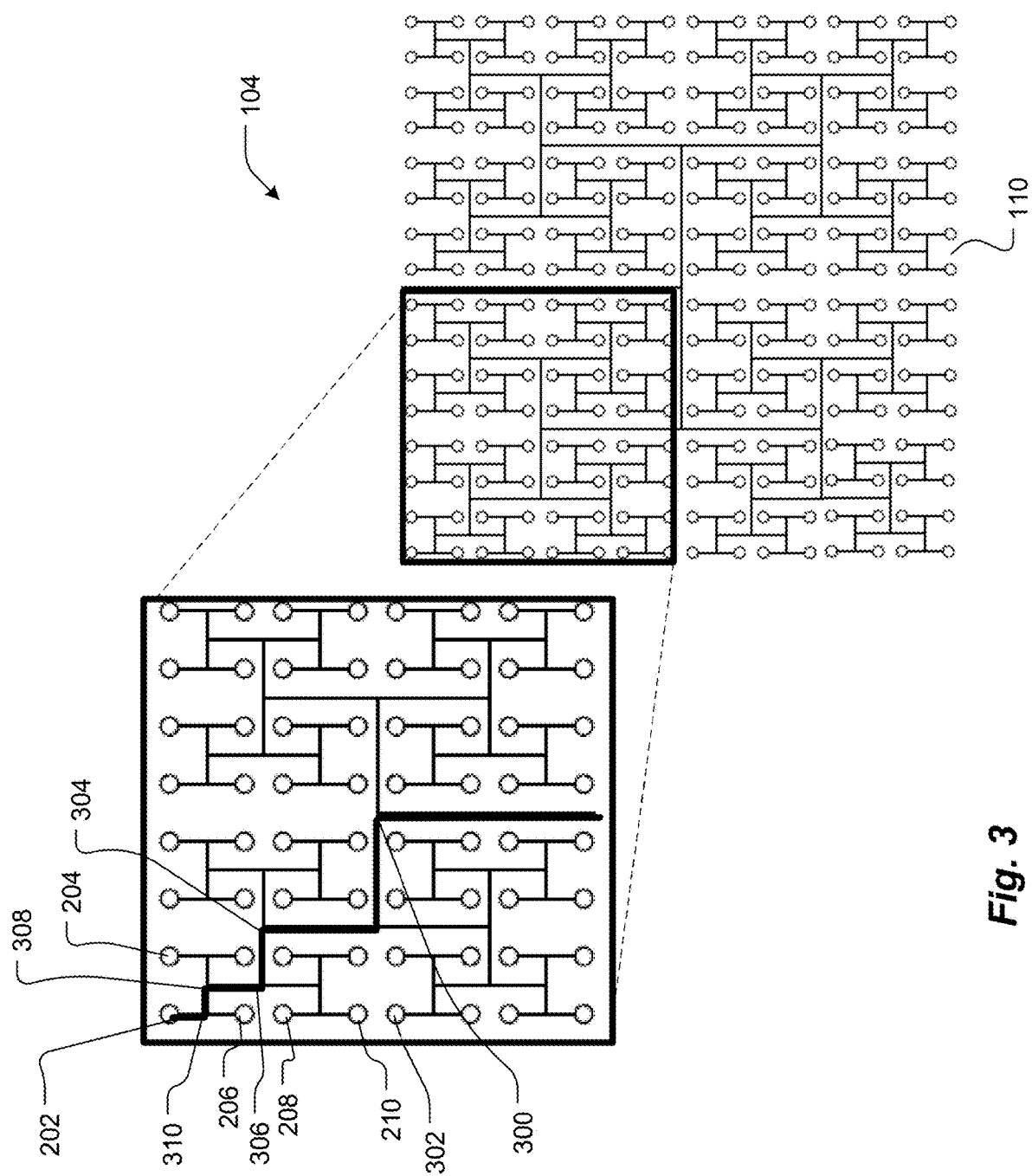
FIG. 3 is a schematic diagram illustrating an "H-tree" arrangement of optical waveguides in the optical switch network of FIGS. 1 and 2, according to an embodiment of the present invention.

FIG. 3 is a schematic diagram illustrating the optical switch network 104, according to an embodiment of the present invention. The right side of FIG. 3 shows an "H-tree" arrangement of optical waveguides (a branched optical waveguide network), rooted at the common input/output port 110. The left side of FIG. 3 shows a portion of the right side enlarged. Ports 202-210 are shown in FIG. 3.

A binary optical switch is disposed at each junction of two optical waveguides of the H-tree, as exemplified by binary optical switches 300, 302, 304, 306, 308 and 310. A binary optical switch routes an optical signal along either of two optical paths. Thus, the binary optical switches 300-308 determine a route for an optical signal traveling through the H-tree. In some embodiments, a binary optical switch routes an optical signal along at most one of the two optical paths. For example, if an optical signal in introduced into the common input/output port 110, the binary optical switches 300-308 route the optical signal to one of the N ports 202-210. In the example depicted in FIG. 3, the optical signal is routed to port 202.

Figure 4:
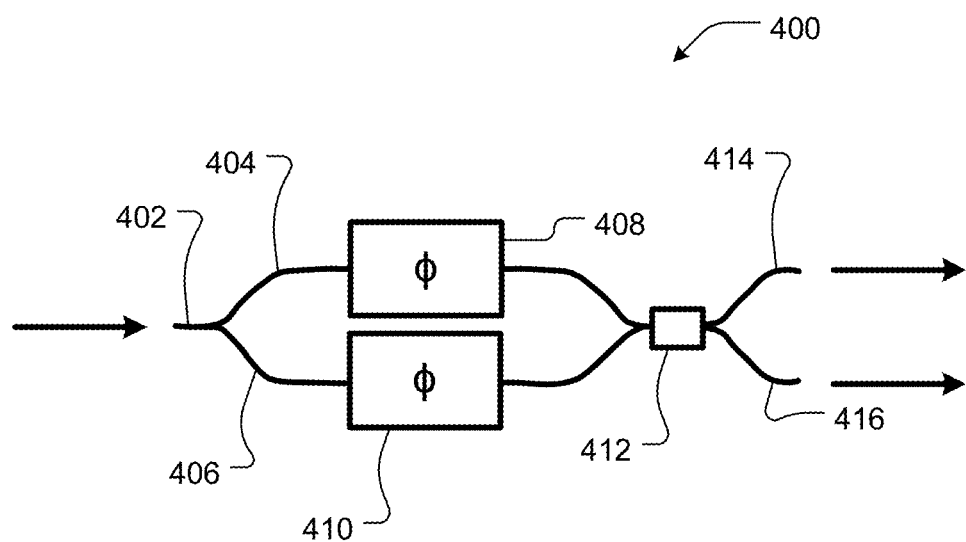
FIG. 4 is a schematic diagram illustrating a binary optical switch, implemented with a Mach-Zender interferometer, of the optical switch network of FIGS. 1-3, according to an embodiment of the present invention.

In some embodiments, each binary optical switch is implemented with a Mach-Zender interferometer. An example of such a binary optical switch 400 is shown schematically in FIG. 4. Light at input 402 is split between two paths 404 and 406. A phase shifter 408 and/or 410 is selectively enabled on one or both of the paths 404 and 406, and then the light is recombined by a 2×2 coupler 412. The relative phases of the light in the two paths 404 and 406 determines whether the light couples to a first output 414 or a second output 416 or both outputs 414 and 416 of the 2×2 coupler 412. The phase shifters 408 and 410 may be implemented using electro-optic or thermo-optic effects, by a MEMS device, or any other suitable phase shifter.

Alternatively, the binary optical switches 300-310 may be implemented with ring resonators, microelectromechanical systems (MEMS) devices, such as MEMS mirrors, or any other suitable binary optical switch.

The optical switch network 104 includes a nested array of binary optical switches 300-310 arranged in an H-tree pattern. The nested nature of the array means that L layers of binary optical switches 300-310 may be used to select among $2^L$ possible ports 200. Thus, the number of active binary optical switches is log 2(N), instead of N, where N is the number of ports 200 (possible beam directions).

As can be seen in FIG. 3, a relatively small number, compared to the number of leaves in the H-tree, i.e., the number of ports 200, of the binary optical switches 300-310 need to be operated, i.e. ON, to route the optical signal from the common input/output port 110 to the selected port 202. For example, in the left side of FIG. 3, six switches, i.e., three left/right binary optical switches 300, 304 and 308, and three up/down binary optical switches 302, 306 and 310, allow selection of any of 64 possible ports 200. In most embodiments, only one switch at a given level is operated at one time. This small number of switches therefore consumes much less energy than phase shifters in a comparable optical phased array. In addition, the binary optical switches 300-310 merely need to operate in a bi-level state, whereas phased arrays need arbitrary control of phase-shifters for steering. Furthermore, these embodiments are suitable for broadband light, allowing multiple channels to be sent and/or received at a time using wavelength division multiplexing.

Although the optical switch network 104 is described as including an H-tree arrangement of optical waveguides, any suitable branched optical waveguide network that provides a nested array of binary optical switches may be used. For example, other fractal arrangements may be used, as well as non-fractal arrangements. As used herein, fractal means self-similar across different scales. As used herein, a fractal pattern is not infinitely complex.

Addressing Binary Optical Switches

Figure 5:
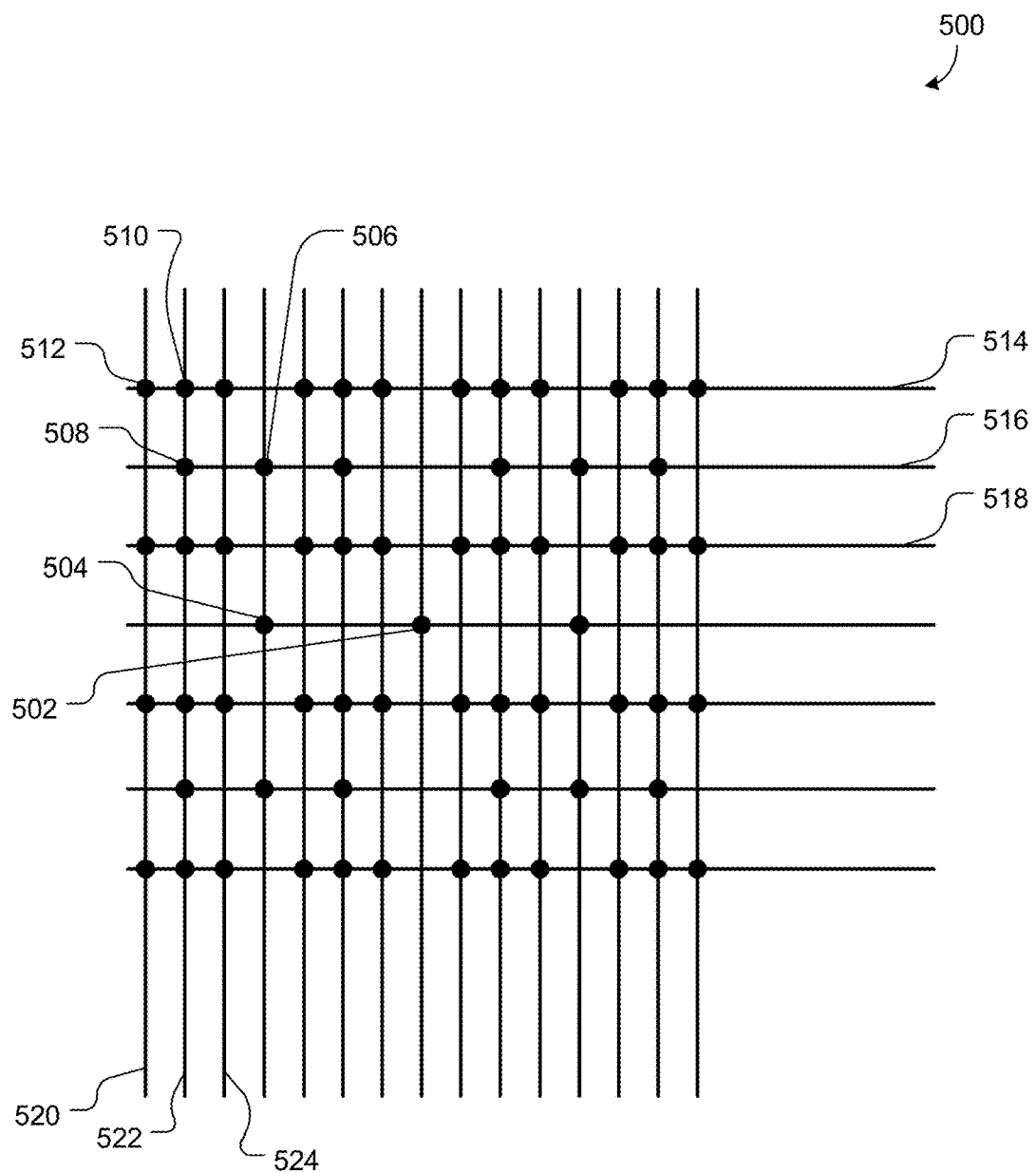
FIG. 5 is a schematic diagram illustrating one possible means to address a port of the plurality of ports of FIG. 2 on the surface of the optical switch network, i.e., by a row/column addressing matrix, according to an embodiment of the present invention.

The binary optical switches 300-310 may be addressed and/or actuated by any suitable arrangement, such as by a row-and-column addressing matrix 500, as shown schematically in FIG. 5. Each binary optical switch 300-310 may be actuated by a respective 2-input AND gate, to which the binary optical switch is electrically coupled. The AND gates may be arranged in a pattern that registers with the pattern of the binary optical switches 300-310. The AND gates in FIG. 5, represented by AND gates 502, 504, 506, 508, 510 and 512, register with the binary optical switches 300-310 in FIG. 3. AND gate 502 registers with binary optical switch 300, AND gate 504 registers with binary optical switch 302, etc.

Each AND gate is disposed at an intersection of a corresponding row wire and a corresponding column wire, represented by row wires 514, 516 and 518 and column wires 520, 522 and 524. One input of each AND gate is electrically coupled to the AND gate's corresponding row wire, and the other input of the AND gate is electrically coupled to the AND gate's corresponding column wire. Thus, a logic "1" (TRUE) signal on one row, and a logic "1" (TRUE) signal on one column uniquely enable one of the AND gates, and the enabled AND gate actuates the respective binary optical switch.

Once actuated, the binary optical switch may remain actuated for a predetermined amount of time. Optionally or alternatively, once actuated, the binary optical switch may remain actuated until the binary optical switch receives a reset signal. A reset line (not shown) may extend to all the binary optical switches 300-310 to facilitate simultaneously resetting all actuated binary optical switches 300-310. Resetting the binary optical switches is discussed in more detail below.

The row-and-column addressing matrix 500 may be used to sequentially actuate selected ones of the binary optical switches 300-310 that lie along a desired optical path through the H-tree, between the common input/output port 110 and a selected port of the N ports 200. That is, the row-and-column addressing matrix 500 may be used actuate a first one of the binary optical switches 300-310, then before the first binary optical switch resets, the row-and-column addressing matrix 500 may be used actuate a second (different) one of the binary optical switches 300-310, etc., until all the selected binary optical switches 300-310 that lie along the desired optical path through the H-tree have been actuated.

Each actuated binary optical switch needs to receive an instruction regarding a direction in which to direct light. For this purpose, each binary optical switch 300-310 may also be coupled to an additional similar row-and-column addressing matrixes (not shown), or the row-and-column matrix 500 may serve as the additional matrixes in a time-multiplexed fashion. The additional similar row-and-column addressing matrix may be used to send signals to each actuated binary optical switch that is to direct light in one direction, ex. "left," in order to route the optical signal from the common input/output port 110 to the selected port 202. Actuated binary optical switches that do not receive this "left" signal may safely assume they are to direct light in the opposite direction, ex. "right."

After the actuated binary optical switches have had time to switch to their respective commanded directions, the common input/output port 110 will be in optical communication with the selected port 202, and the receiver 112 and/or the transmitter 114 may operate. The receiver 112 and/or the transmitter 114 may operate for a fixed period of time or until a different direction of the light rays 106 is needed.

After a transmission and/or reception is complete, or when a different light path through the optical switch network 104 is needed, such as after a predetermined time period or when a different direction of the light rays 106 is needed, the binary optical switches 300-310 are reset. As noted, the binary optical switches may remain actuated for a predetermined amount of time, such as an amount of time sufficient to actuate all the binary optical switches needed to establish a desired optical path through the optical switch network 104 and send and/or receive an optical signal. Optionally or alternatively, the actuated binary optical switches may be reset by the reset signal described above.

Figure 6:
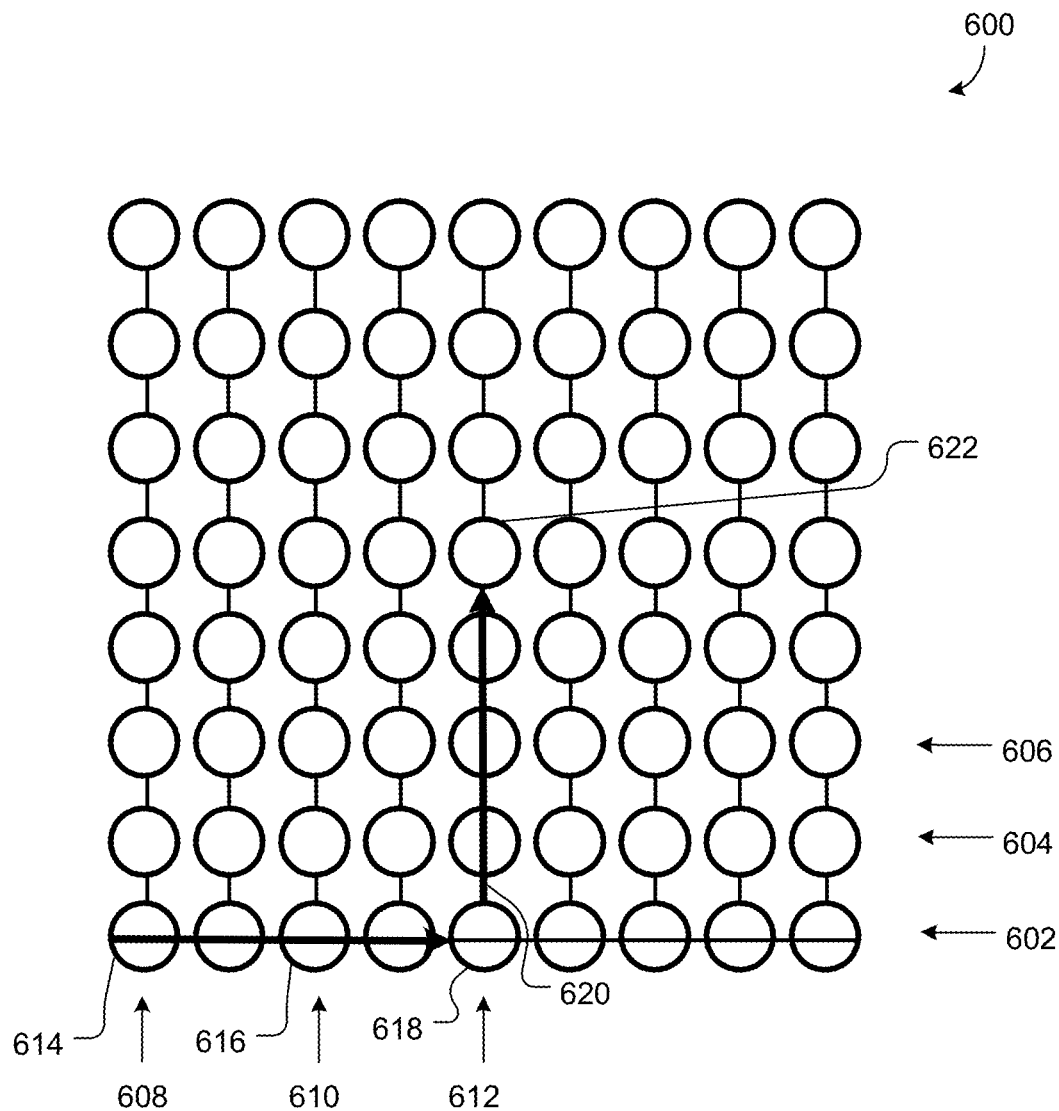
FIG. 6 is a schematic diagram illustrating another possible means to address a port of the plurality of ports of FIG. 2 on the surface of the optical switch network, i.e., by another row/column addressing matrix, according to an embodiment of the present invention.

Another suitable such row and column addressing matrix 600 is shown schematically in FIG. 6, although for simplicity, the matrix 600 is shown as a square matrix. Rows of the matrix 600 are exemplified by rows 602, 604 and 606, and columns of the matrix 600 are exemplified by columns 608, 610 and 612. Respective transistors, represented by transistors 614, 616 and 618, in the first row 602 selectively electrically couple the first row 602 to the columns 608-612. A voltage is applied to the first row 602, thereby making a current available to flow in the first row 602. Thus, a first-row transistor, such as transistor 618 that is ON, as indicated by a surrounding circle, directs current to a selected column, in this case column 612, as shown by a heavy arrow 620.

In each column, respective transistors couple the column to corresponding binary optical switches (not shown in FIG. 6). A transistor in the powered column 612, such as transistor 622, that is ON, as indicated by a surrounding circle, is electrically coupled, and directs current, to its corresponding binary optical switch, thereby activating the binary optical switch.

Alternatively, for ease of addressing, a whole row 502-506 of transistors can be turned on at the same time, without affecting the device operation, other than the extra power used to turn on the extra transistors. The transistors can be activated directly or by use of a shift-operator, for example.

Returning to FIG. 1, the lens 102 allows for a very large effective aperture area by decoupling the size of the aperture from the number of phase shift elements, and thus power consumption, of the all-solid state optical transmit/receive terminal 100. Using binary optical switches in an optical switch network in a planer chip to control the output of a beam in 2- or 3-dimensional space represents a novel aspect of the present disclosure. Similarly, using a lens 102 to direct the beam out of such a chip represents a novel aspect of the present disclosure.

Coarse and Fine Hybrid

Some applications require very fine positioning of a light beam over a large field of view. Requirements of positioning of one part in half a million in each direction is not unheard of. A hybrid approach, which adds another positioning scheme to an embodiment as described above, can achieve such a large dynamic range. The hybrid approach breaks the problem of fine positioning over a large field of view into two separate problems: one of coarse positioning control, and the other of fine positioning control.

Figure 7:
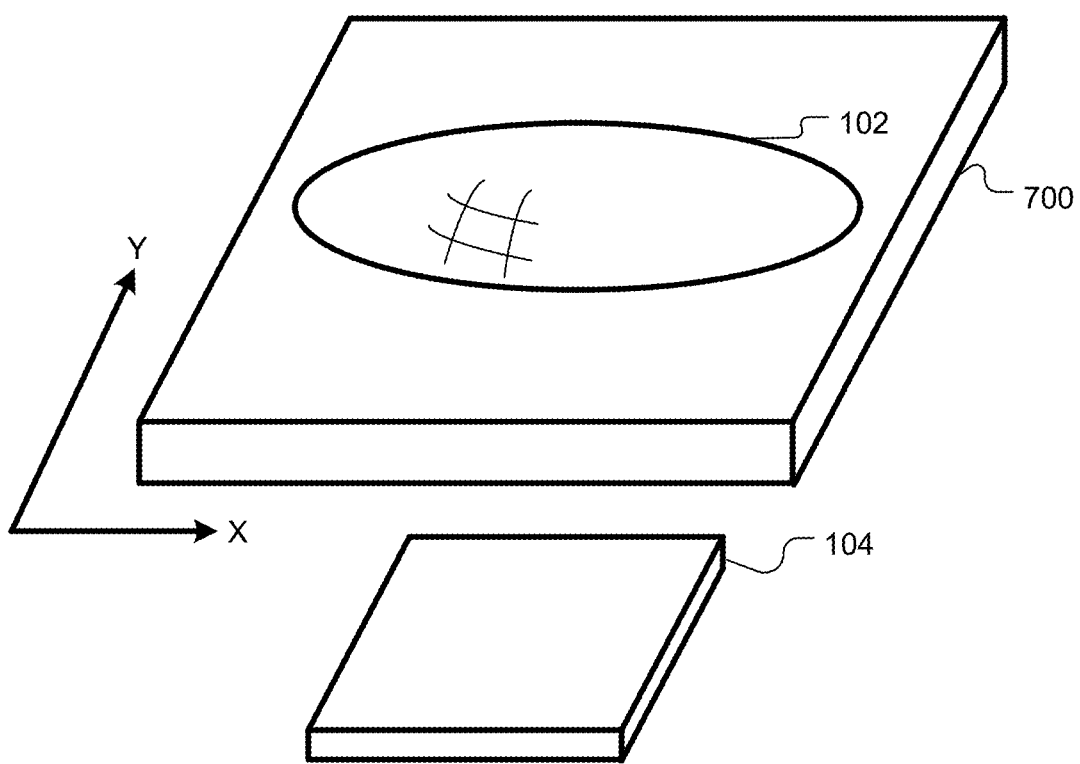
FIGS. 7, 8 and 9 are schematic diagrams illustrating hybrid coarse/fine positioning arrangements, according to respective embodiments of the present invention.
Figure 8:
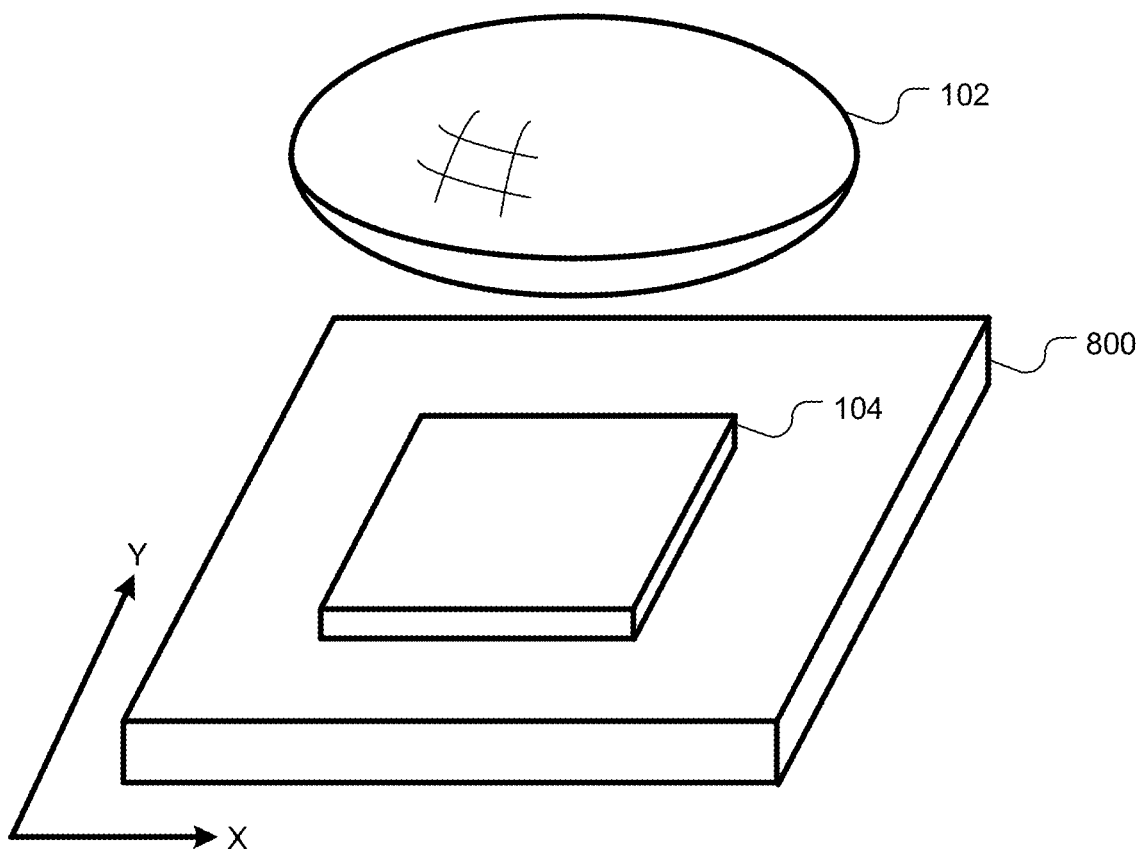
Figure 9:
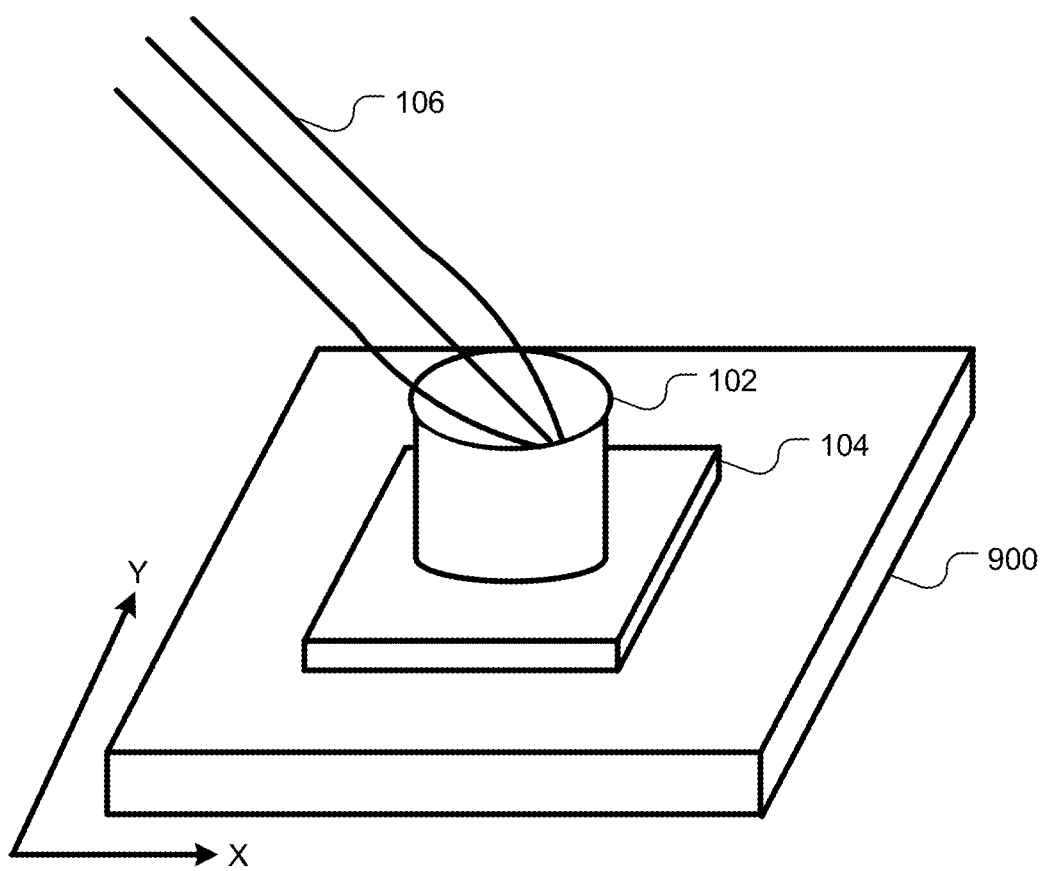
Figure 17:
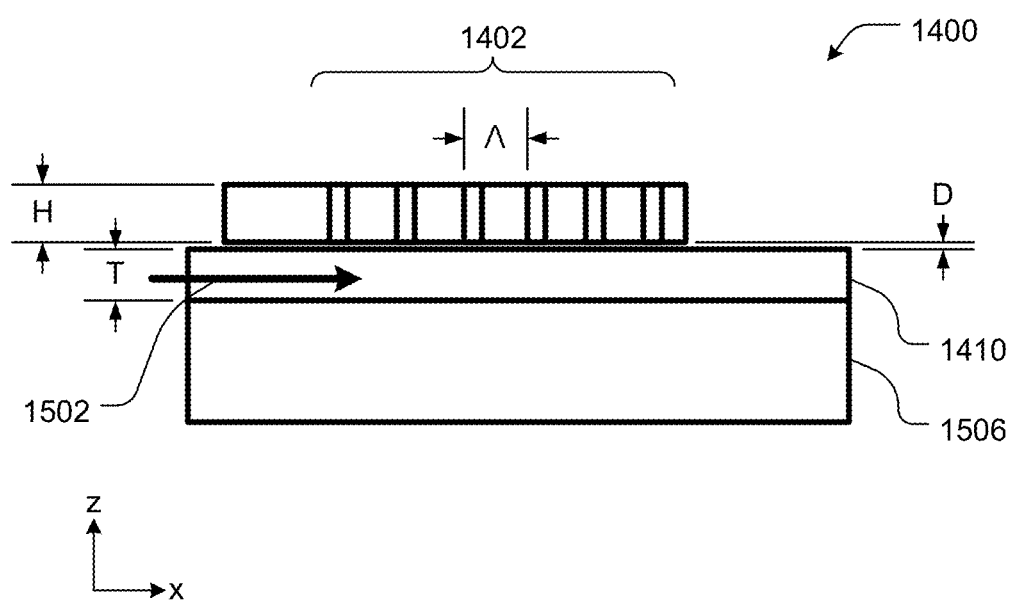
FIG. 17 is another schematic side view of the binary optical switch of FIGS. 14-16 in the ON position showing representative dimensions, according to an embodiment of the present invention.

In one embodiment, the coarse positioning control may be achieved using the optical transmit/receive terminal 100, i.e., using an optical switch network as described above, and the fine control may be achieved by physically shifting the lens 102, relative to the optical switch network 104, as schematically illustrated in FIG. 7, or by physically shifting the optical switch network 104, relative to the lens 102, as schematically illustrated in FIG. 17. For example, as shown in FIG. 7, the lens 102 may be mounted on an x-y stage 700, or as shown in FIG. 17, the optical switch network 104 may be mounted on an x-y stage 800. Alternatively, as shown schematically in FIG. 9, the coarse control may be achieved by physically shifting the lens 102 together with the optical switch network 104, such as by an x-y stage 900, and the optical switch network in the optical transmit/receive terminal 100 may be used to achieve fine and fast beam movement.

Figure 10:
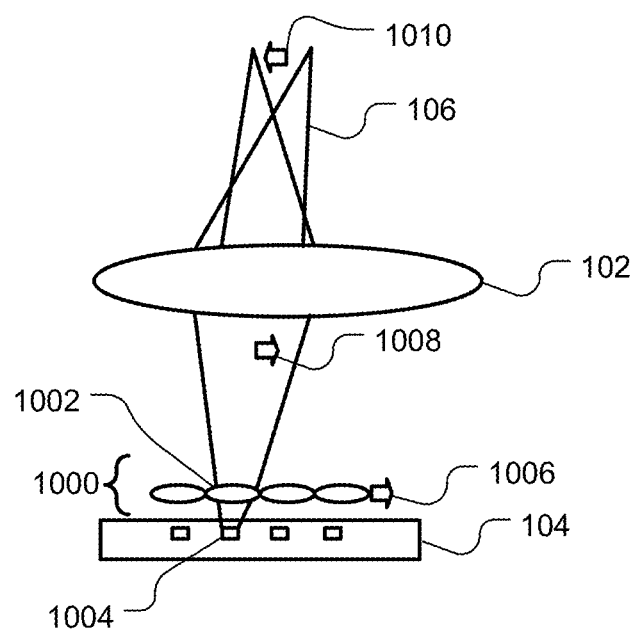
FIG. 10 schematically illustrates a lens array placed between a plurality of ports, such as the ports of FIG. 2, and a focusing optic to optically scan an optical transmit/receive terminal, according to another embodiment of the present invention.

Alternatively, as schematically illustrated in FIG. 10, an intermediate optic 1000, such as a lenslet array, may be disposed optically between the lens 102 and the ports 200 of the optical switch network 104, and the intermediate optic 1000 may be physically shifted, such as by an x-y stage (not shown). The lenslet array may include one lenslet for each port of the ports 200. Each lenslet, represented by lenslet 1002, of the lenslet array should, in its unshifted position, register on the center of a corresponding port, represented by port 1004 of the ports 200.

Shifting the intermediate optic 1000, for example as indicated by an arrow 1006, shifts the light beam between the port 1004 and the lens 102, as indicated by an arrow 1008, which shifts the light beam emitted or received by the lens 102 to or from free space, as indicated by an arrow 1010. The intermediate optic 1000 may be scanned, thereby scanning the light rays 106, such as to perform a raster scan.

Figure 11:
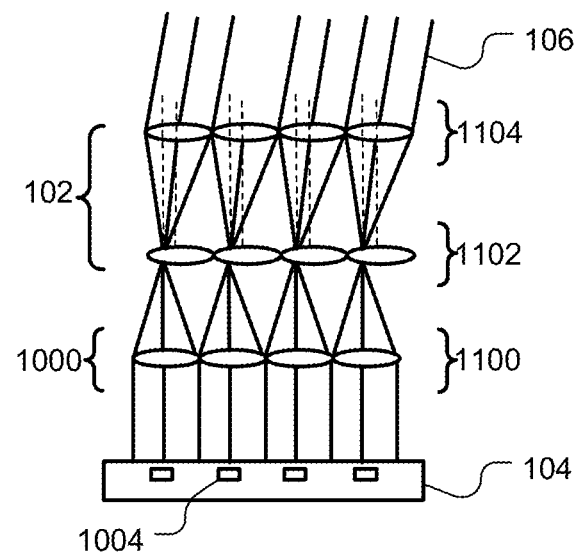
FIG. 11 schematically illustrates a series of lens-arrays, rather than the single lens array and focusing optic of FIG. 10, used to improve performance, such as avoiding aberration, according to another embodiment of the present invention.

A single array of lenslets used as the intermediate optic 1000 may be limited in diversion angle and may introduce aberrations. Several arrays of lenslets, exemplified by lenslet arrays 1100, 1102 and 1104 shown schematically in FIG. 11, may be disposed in series following the optical switch network 104 to overcome these issues. In this case, the lens 102 may be replaced by one or more of the lenslet arrays, such as lenslet arrays 1102 and 1104, disposed optically furthest from the optical switch network 104. Two or more of the lenslet arrays 1100-1102 may be physically shifted, separately such as by respective x-y stages (not shown), to shift or scan the light rays 106. In the embodiment shown in FIG. 11, the last two lenslet arrays 1102 and 1104 are shifted together, such as by a single x-y stage.

Alternatively, the intermediate optic 1000 may include a single large lens (not shown) that is shiftable, such as by an x-y stage, and large enough to optically encompass, throughout its range of shifting, the entire field between all the ports 200 of the optical switch network 104 and the lens 102.

Multiple Beams

In the above described embodiments, the binary optical switches 300-310 fully direct the light down one path or another. In other embodiments, some or all the binary optical switches split the light evenly or arbitrarily among more than one path through the H-tree, making it possible to direct multiple beams 106 in different directions simultaneously. To achieve this, suitable changes are made to the binary optical switches and addressing scheme described herein, since multiple switches at each level may need to be addressed.

Figure 12:
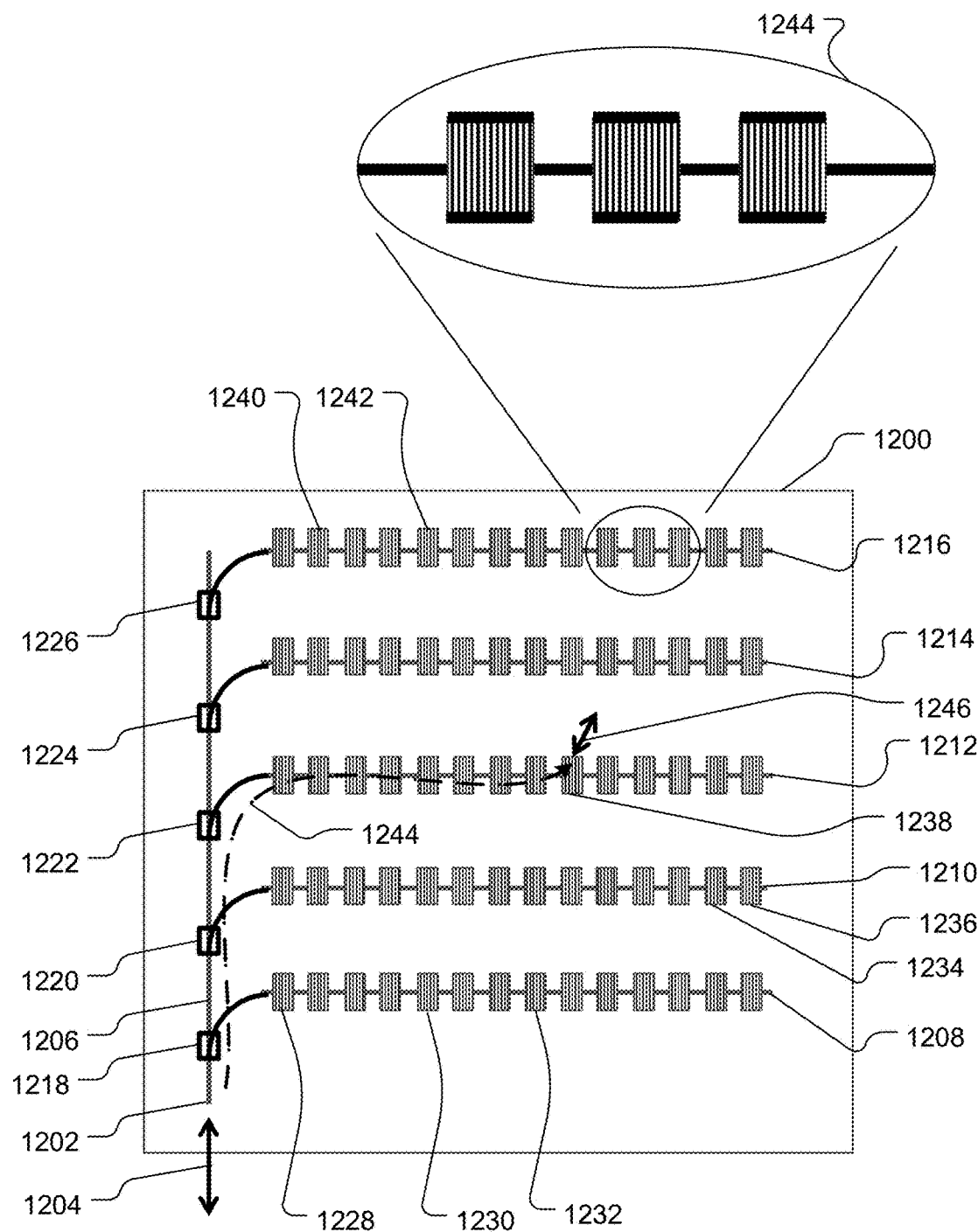
FIG. 12 is a schematic diagram illustrating another optical switch network that may replace the optical switch network of FIG. 3, according to an embodiment of the present invention.

Integrated MEMS Switches for Selectively Coupling Light In and Out of a Waveguide Limitations on the densities at which the binary optical switches 300-310 may be fabricated may limit spatial resolution of the transmit/receive terminal 100, i.e., density of possible transmit or receive beam positions. FIG. 12 is a schematic diagram illustrating an optical switch network 1200 that may replace the optical switch network 104 (FIG. 1), according to another embodiment of the present invention. The optical switch network 1200 may provide higher switch densities than the optical switch network 104 described above. In this embodiment, an optical switch network employs MEMS-based binary optical switches to steer an optical beam.

The MEMS-based binary optical switches may be significantly smaller than the H-tree based binary optical switches 300-310. Consequently, the MEMS-based binary optical switches may be fabricated or packed at a higher density than in the prior art, providing higher spatial resolution of a transmit/receive terminal, i.e., density of possible transmit/receive beam positions. As with the all-solid state optical transmit/receive terminal 100, a relatively small subset of the MEMS-based switches needs to be operated, therefore powered, at any given time. Therefore, a terminal that includes the optical switch network 1200 overcomes the mechanical, switch density, emitter density and high power problems associated with the prior art.

The optical switch network 1200 includes a common input/output port 1202. Light may enter and/or exit the common input/output port 1202, as indicated by a double-headed arrow 1204. The common input/output port 1202 is optically coupled to a first optical waveguide 1206. The optical switch network 1200 also includes a plurality of second optical waveguides, represented by optical waveguides 1208, 1210, 1212, 1214 and 1216. Each second optical waveguide 1208-1216 is optically coupled to the first optical waveguide 1206 via a respective first binary optical switch, represented by first binary optical switches 1218, 1220, 1222, 1224 and 1226.

In some embodiments, each first binary optical switch 1218-1226 acts as a single-pole, double-throw (SPDT) switch. Thus, assuming light enters the common input/output port 1202, the first binary optical switch 1218 selectively either allows the light to continue along the first optical waveguide 1206 or diverts the light to the second optical waveguide 1208, but not both. Thus, collectively, the first binary optical switches 1218-1226 control to which second optical waveguide 1208-1216 the light is diverted. Similarly, collectively the first binary optical switches 1218-1226 control from which second optical waveguide 1208-1216 light is routed to the first optical waveguide 1206 and, thence, to the common input/output port 1202, in a receive mode. Although five second optical waveguides 1208-1216 and five first binary optical switches 1218-1226 are shown, any suitable number of second waveguides and first binary optical switches may be included.

A respective plurality of second binary optical switches, represented by second binary optical switches 1228, 1230, 1232, 1234, 1236, 1238, 1240 and 1242, is optically coupled to each second optical waveguide 1208-1216. For example, second binary optical switches 1228-1232 are optically coupled to the second optical waveguide 1208. Each second binary optical switch 1228-1242 may selectively optically couple the respective second optical waveguide 1208, 1210, 1212, 1214 or 1216 to free space. The second binary optical switches 1228-1242 may be coupled between the second optical waveguides 1208-1216 and the N ports 202-210 (FIG. 2), or each second binary optical switch 1228-1242 may form part or all of one of the N ports 202-210.

In some embodiments, each second binary optical switch 1228-1242 acts as a single-pole, double-throw (SPDT) switch. Thus, assuming light enters the common input/output port 1202 and is routed by the first binary optical switch 1222 to the second optical waveguide 1212, as indicated by a dashed line 1244, the second binary optical switch 1238 selectively either allows the light to continue along the second optical waveguide 1212 or diverts the light out of the second optical waveguide 1212, as indicated by a two-headed arrow 1246. The two-headed arrow 1246 extends out of the plane of the drawing. Thus, collectively, the second binary optical switches 1228-1242 control to which port of the N ports 202-210 the light is diverted. Similarly, collectively, the second binary optical switches 1228-1242 control from which port of the N ports 202-210 light is routed to the first optical waveguide 1206 and, thence, to the common input/output port 1202 in the receive mode.

Although 14 second binary optical switches are shown coupled to each second optical waveguide 1208-1216, any number of second binary optical switches may be included. All the second optical waveguides 322-1242 need not have equal numbers of second binary optical switches 1228-1242.

Each first and second binary optical switch 1218-1226 and 1228-1242 is binary, i.e., an ON-OFF or other switch having exactly two positions or states. Thus, the first and second binary optical switches 1218-1226 and 1228-1242 determine an optical route for an optical signal traveling through the switch array 1200, between the common input/output port 1202 and a selected port of the N ports 202-210, for example as exemplified by the dashed line 1244.

Each first binary optical switch 1218-1226 may be implemented by any suitable optical switch. In some embodiments, each first binary optical switch 1218-1226 is implemented by a pair of MEMS-actuated adiabatic optical couplers. Such a switch cell is described in Tae Joon Seok, et al., "Large-scale broadband digital silicon photonic switches with vertical adiabatic couplers," Optica, Vol. 3, No. 1, pp. 64-70, January, 2016, ("Seok") and Tae Joon Seok, et al., "Large-scale broadband digital silicon photonic switches with vertical adiabatic couplers: supplemental material," ("Seok supplement"), the entire contents of which are hereby incorporated by reference herein, for all purposes. Each first binary optical switch 1218-1226 may be implemented using two optical waveguides. However, unlike what is described in Seok, the two waveguides need not cross, but the principal of the switch is similar. A switching element that includes a pair of MEMS-actuated adiabatic couplers may be disposed optically between the two optical waveguides. See, for example, Seok, FIG. 1 (reproduced in the present application, with annotations, as FIG. 13).

Figure 13:
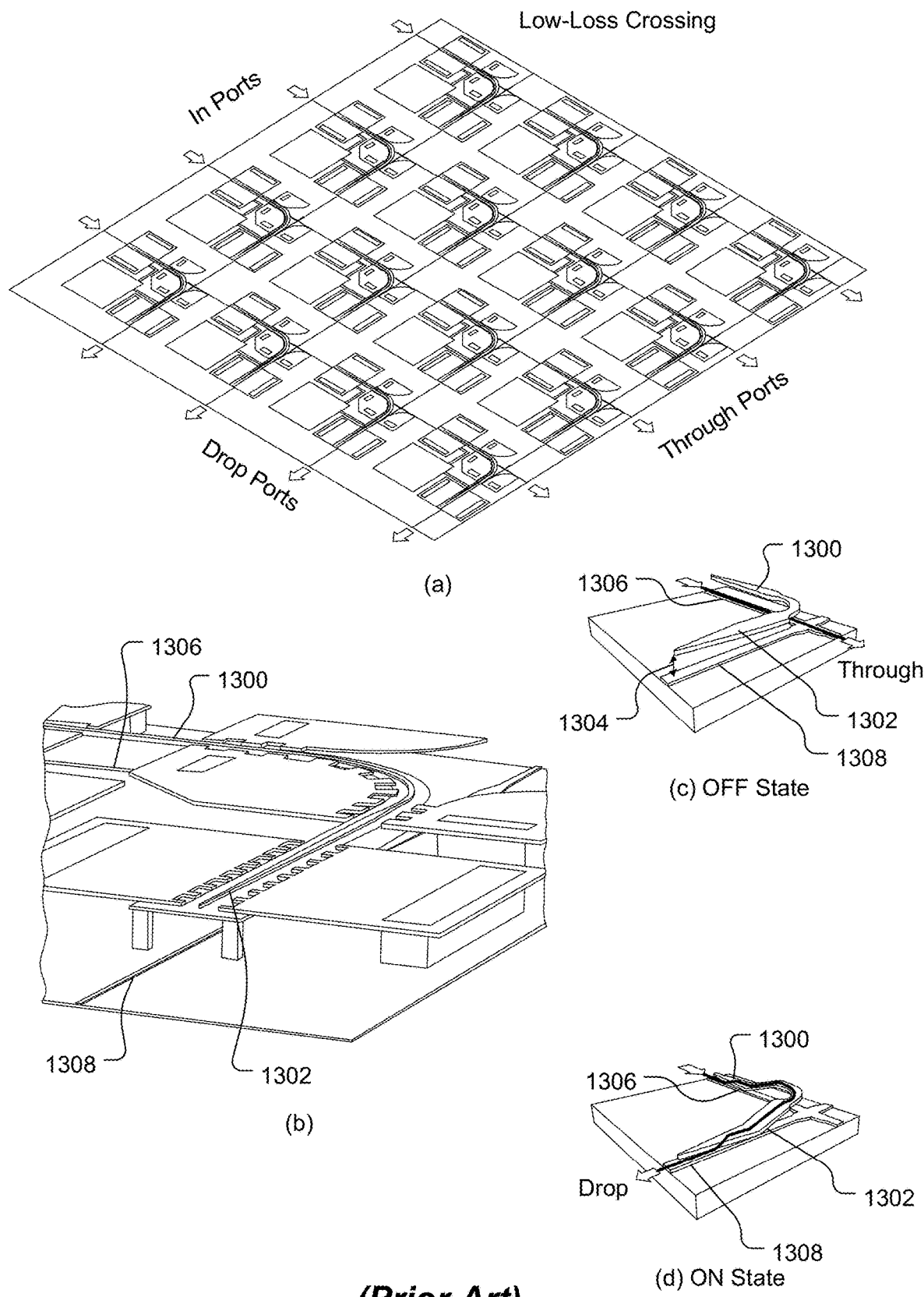
FIG. 13 is an annotated reproduction of a diagram from Seok, according to the prior art.

In an OFF state (FIG. 13, part (c)), the adiabatic couplers, exemplified by adiabatic couplers 1300 and 1302, are located far enough 1304, such as about 1 μm above, the optical waveguides, exemplified by optical waveguides 1306 and 1308, so light continues to propagate along one of the waveguides 1306 (as indicated by "Through"), without appreciably coupling to the other waveguide 1308. However, in the ON state (FIG. 13, part (d)), the adiabatic couplers 1300 and 1302 are physically moved toward the waveguides 1306 and 1308 by MEMS electrostatic gap-closing actuators, and light is therefore efficiently coupled from one of the waveguides 1306 into one of the adiabatic couplers 1300, and between the other adiabatic coupler 1302 and the other waveguide 1308 (as indicated by "Drop").

Alternatively, each first binary optical switch 1218-1226 (FIG. 12) may be implemented using a standard Mach-Zehnder interferometer type switch, for example with thermal phase shifters, as discussed above, with respect to FIG. 4.

As noted, the surface 107 (FIG. 1) of the optical switch network 104 has N ports 202-210, and the lens 102 focuses incoming light rays 106 onto the N ports 202-210, and/or the lens 102 projects optical signals emitted via any subset of the N ports 202-210 into space. Optical gratings are efficient devices for emitting light out of the plane of the second optical waveguides 1208-1216 or coupling out-of-plane light into the second optical waveguides 1208-1216, as indicated by the two-headed arrow 1246 (FIG. 12). An optical grating is a spatially periodic structure that defines a plurality of regions having a first refractive index, interspersed with regions having a different second refractive index. The spatial period is selected based on the wavelength of interest. In some cases, periodic grooves are defined in a material. In other cases, two different materials, having different refractive indexes, are alternated. For simplicity of explanation, the term "groove" is used herein to represent an actual groove, i.e., void, or one of the two alternating materials of an optical grating.

Such optical gratings may be disposed at or near the surface 107 (FIG. 1). Each second binary optical switch 1228-1242 (FIG. 12) may include such an optical grating. In particular, each second binary optical switch 1228-1242 may be implemented by a physically translatable optical grating, i.e., an optical grating that is configured to physically translate between at least two positions. In a first ("ON") position, the optical grating is sufficiently close to one of the second optical waveguides 1208-1216 to optically couple with the second optical waveguide with a coupling efficiency, at a wavelength of interest, of at least about 25%. In a second ("OFF") position, the optical grating is sufficiently far from the second optical waveguide to optically couple with the second optical waveguide with a coupling efficiency, at the wavelength of interest, of at most about 5%, preferably less than 1%. FIG. 12 shows three of the second binary optical switches 1228-1242 enlarged at 1244.

Each second binary optical switch 1228-1242 may include a MEMS structure that is configured to selectively translate the translatable optical grating to the ON position and to the OFF position. FIG. 14 is a schematic top view of one binary optical switch 1400 of the second binary optical switches 1228-1242. The binary optical switch 1400 includes a translatable grating 1402. The translatable grating 1402 defines a plurality of parallel or approximately parallel periodic grooves. The grooves are separated by walls, represented by walls 1404, 1406 and 1408. As noted, the grooves and walls may be implemented by respective materials having different refractive indexes. The walls 1404-1408 may be made of silicon, silicon nitride or another suitable material using conventional semiconductor fabrication techniques. The grooves may be voids or made of a suitable material different from the walls 1404-1408. Although the translatable grating 1402 is shown with six walls 1404-1408, any suitable number of walls and/or grooves may be used. The translatable grating 1402 is disposed above a second optical waveguide 1410, one of the second optical waveguides 1208-1216 (FIG. 12).

FIG. 15 is a schematic side view of the binary optical switch 1400 in the OFF position. In the OFF position, the translatable optical grating 1402 is disposed a distance 1500 from the second optical waveguide 1410 sufficient to optically couple with the second optical waveguide 1410 with a coupling efficiency of at most about 5%, preferably less than 1%, and in some embodiments less than 0.1%. In some embodiments, the distance 1500 is about 1 µm (1,000 nm). In some embodiments, the distance 1500 may be about 800 nm. In some embodiments, the distance 1500 may be about 250 nm. In the OFF position, most or substantially all light 1502 in the second optical waveguide 1410 continues along the second optical waveguide 1410, as indicated by an arrow 1504. Similarly, very little or substantially no light from free space couples via the optical grating 1402 into the second optical waveguide 1410.

The second optical waveguide 1410 may be fabricated using conventional semiconductor fabrication techniques on a suitable semiconductor wafer, such as a silicon or silicon nitride wafer. The second optical waveguide 1410 may be fabricated on a suitable oxide or other passivation layer 1506.

FIG. 16 is a schematic side view of the binary optical switch 1400 in the ON position. In the ON position, the translatable optical grating 1402 is disposed a distance 1600 from the second optical waveguide 1410 sufficient to optically couple with the second optical waveguide 1410 with a coupling efficiency of at least about 25%. In some embodiments, the distance 1600 is about 10-50 nm. In the ON position, much, most or substantially all light 1502 in the second optical waveguide 1410 is emitted by the translatable optical grating 1402 into free space, as indicated by an arrow 1602. Similarly, much, most or substantially all light of a suitable mode from free space couples via the optical grating 1402 into the second optical waveguide 1410.

FIG. 17 is another schematic side view of the binary optical switch 1400 in the ON position showing representative dimensions, according to an embodiment of the present invention. The translatable grating 1402 is disposed a distance (D) about 20 nm from the second optical waveguide 1410. The second optical waveguide 1410 is about 150 nm thick (T) silicon on an oxide substrate 1506. The input light beam 1502 is a Gaussian with an about 2.5 µm radius. The translatable grating 1402 is about 50 nm thick (H). The translatable grating 1402 has a groove period ($\Lambda$) of about 580 nm. Appropriate modifications may be made, such as changing the groove period ($\Lambda$) for other wavelengths of light, as would be known by one of ordinary skill in the art.

Figure 18:
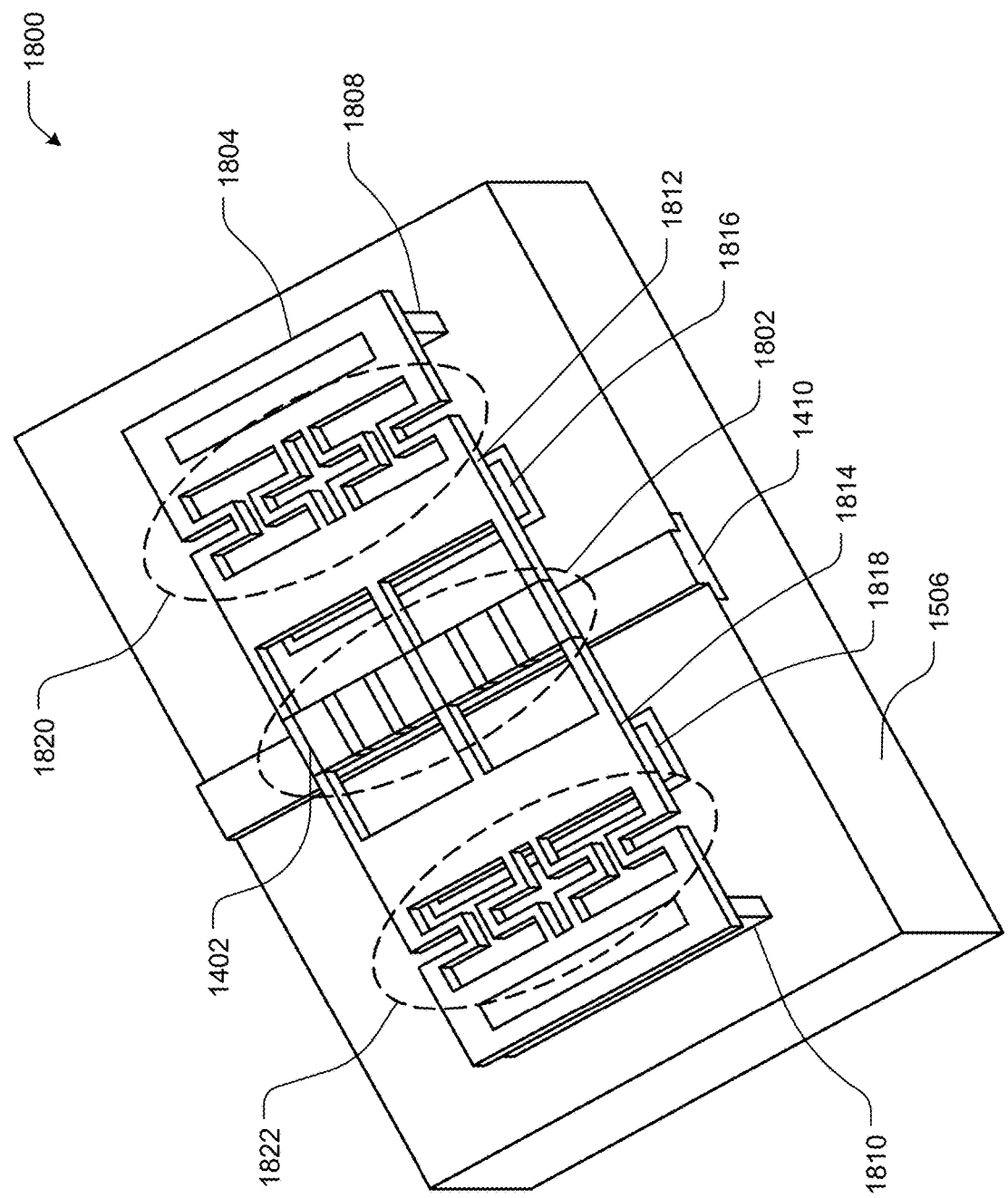
FIGS. 18 and 19 are respective schematic perspective and side views of the optical switch of FIGS. 14-17 in the OFF position, showing an electrostatic MEMS structure configured to selectively translate a translatable optical grating to the ON position and to the OFF position, according to an embodiment of the present invention.
Figure 19:
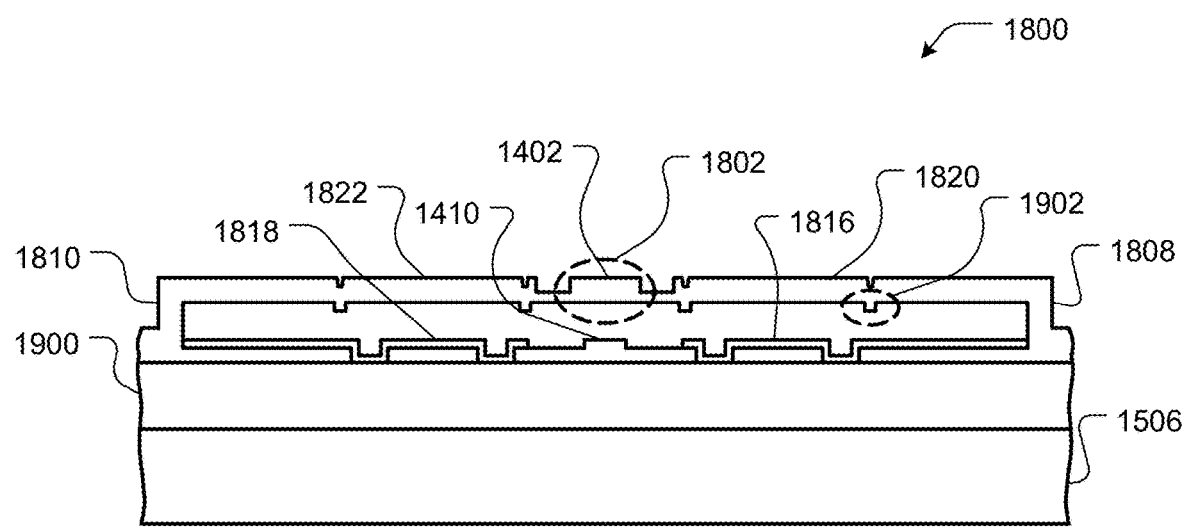
Figure 20:
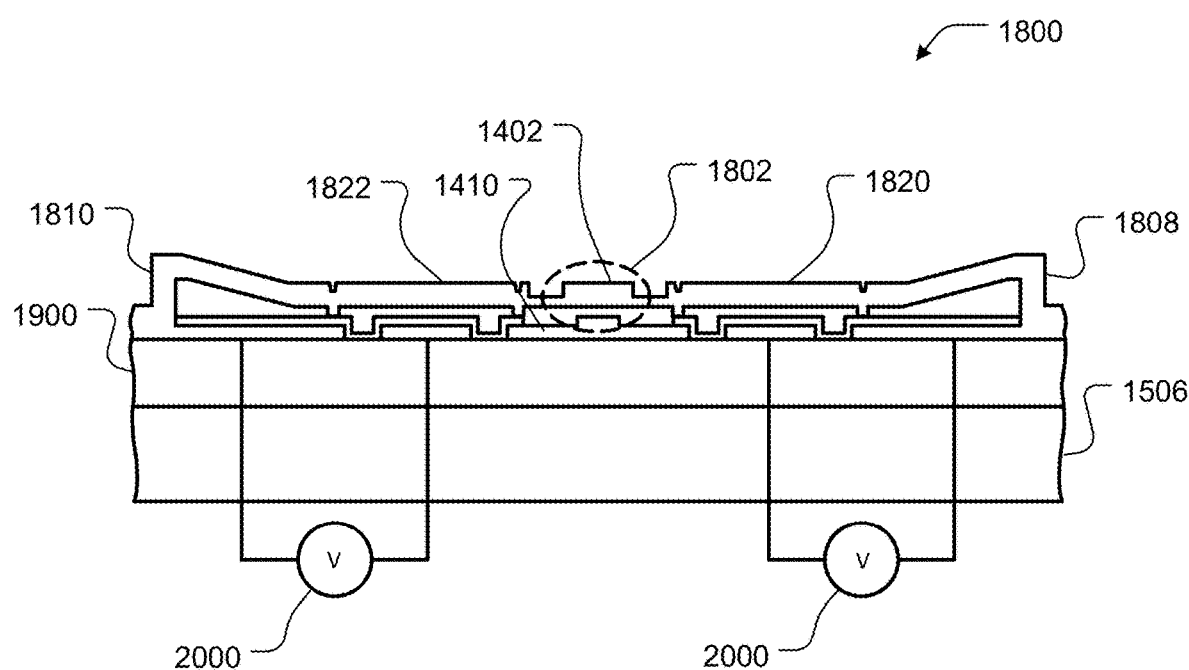
FIG. 20 is a schematic perspective side view of the optical switch of FIGS. 14-19 in the ON position, according to an embodiment of the present invention.

As discussed with respect to FIGS. 14-16, each second optical switch 1228-1242 may include a MEMS structure that is configured to selectively translate the translatable optical grating 1402 to the ON position and to the OFF position. FIGS. 18 and 19 are respective schematic perspective and side views of the optical switch 1400 in the OFF position, showing an electrostatic MEMS structure 1800 configured to selectively translate the translatable optical grating 1400 to the ON position and to the OFF position. FIG. 20 is a schematic perspective side view of the optical switch 1400 in the ON position. The translatable optical grating 1402 is shown within a dashed ellipse 1802.

The translatable optical grating 1402 is part of a bridge 1804. The bridge 1804 is spaced apart from, and disposed above, the substrate 1506. The substrate 1506 may include a buried oxide layer 1900 (FIGS. 19 and 20). The bridge 1804 is supported by respective piers 1808 and 1810. The second optical waveguide 1410 is disposed in or on the substrate 1506 under the translatable optical grating 1402.

The bridge 1804 includes two first electrostatic actuation electrodes 1812 and 1814. Two corresponding second electrostatic actuation electrodes 1816 and 1818 are disposed on the substrate 1506, such that the two first actuation electrodes 1812 and 1814 register over the two second actuation electrodes 1816 and 1818, respectively. The bridge 1804 also includes two flexures 1820 and 1822.

Thus, if an electric potential 2000 is applied across the first and second actuation electrodes 1812-1814 and 1816-1818, as shown schematically in FIG. 20, a resulting electrostatic force urges the first actuation electrodes 1812-1814 and the translatable optical grating 1402 toward the substrate 1506, thereby bringing the translatable optical grating 1402 within an appropriate distance of the second optical waveguide 1410 to turn the optical switch 1400 ON. Absent such an electric potential and the resulting electrostatic force, the flexures 1820 and 1822 return the translatable optical grating 1402 to the OFF position. A boss 1902 (FIG. 19) may be included to limit travel distance of the translatable optical grating 1402 in the ON position. Other aspects of the MEMS structure 1800 are similar to MEMS structures described in Seok and Seok supplement.

Figure 21:
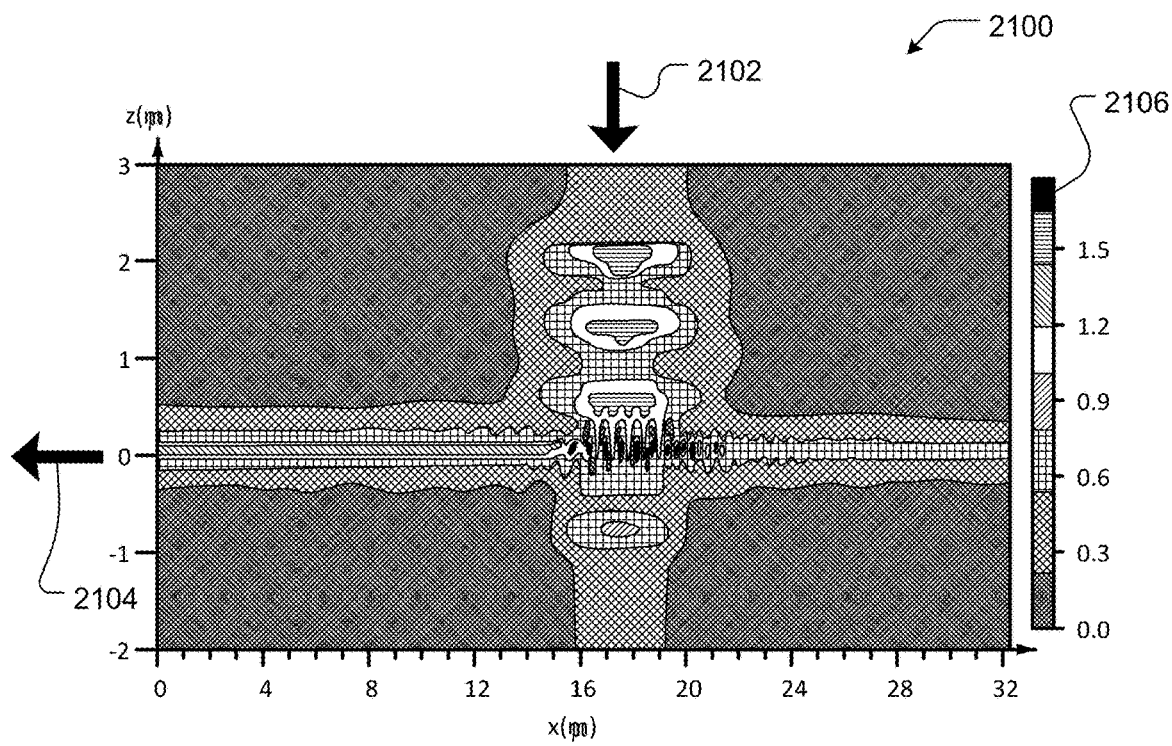
FIGS. 21 and 22 contain graphs illustrating results of computer modeled E-field strength versus z-x location within the optical switch of FIGS. 14-20 in the ON and OFF positions, respectively, according to an embodiment of the present invention.
Figure 22:
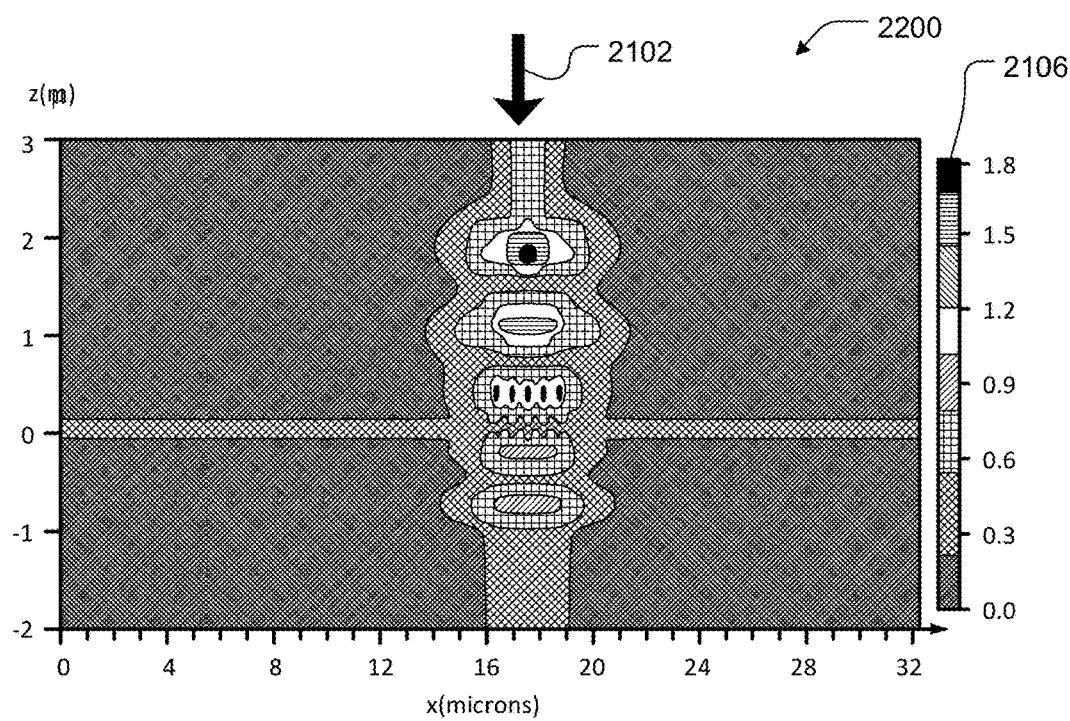

FIGS. 21 and 22 contain graphs 2100 and 2200 illustrating results of computer modeled light intensity (E-field strength squared) versus z-x location within the optical switch 1400 in the ON and OFF positions, respectively. In both plots, the second optical waveguide 1410 is horizontal, and light travels from free space into the second optical waveguide 1410, as indicated by arrows 2102. In FIG. 21, light that couples into the waveguide 1410 via the translatable grating 1402 is indicated by an arrow 2104. In both plots 2100 and 2200 the light wavelength is 1.5-1.6 µm, and the light intensity (E-field strength squared) is color coded 2106. For the plot 2100 (optical switch 1400 ON), the translatable grating 1402 is disposed 20 nm from the second optical waveguide 1410, whereas for the plot 2200 (optical switch 1400 OFF), the translatable grating 1402 is disposed 250 nm from the second optical waveguide 1410.

As can be seen in FIG. 12, a relatively small number, such as one each, of the first and second optical switches 1218-1226 and 1228-1242 needs to be operated, i.e., ON, to route an optical signal from the common input/output port 1202 to the selected port 1238. This small number of switches therefore consumes much less energy than phase shifters in a comparable optical phased array. In addition, the MEMS-based first and second optical switches 1218-1226 and 1228-1242 may be smaller, and may therefore be fabricated or packed more densely, than phase shifters or binary optical switches of an H-tree.

In the described embodiments, the first and second optical switches 1218-1226 and 1228-1242 fully direct the light down one path or another. In other embodiments, the optical switch network 1200 (FIG. 12) is partitioned into multiple optical switch networks, each operating independently and each handling a non-overlapping subset of the N ports 202-210. This is similar to including multiple optical switches 104 in the optical transmit/receive terminal 100 (FIG. 1). Multiple optical switch networks 104, or a partitioned optical switch network 104, can handle multiple diverse light rays 106, i.e., each light ray 106 being directed in a different direction is space.

Tiled Display

Figure 23:
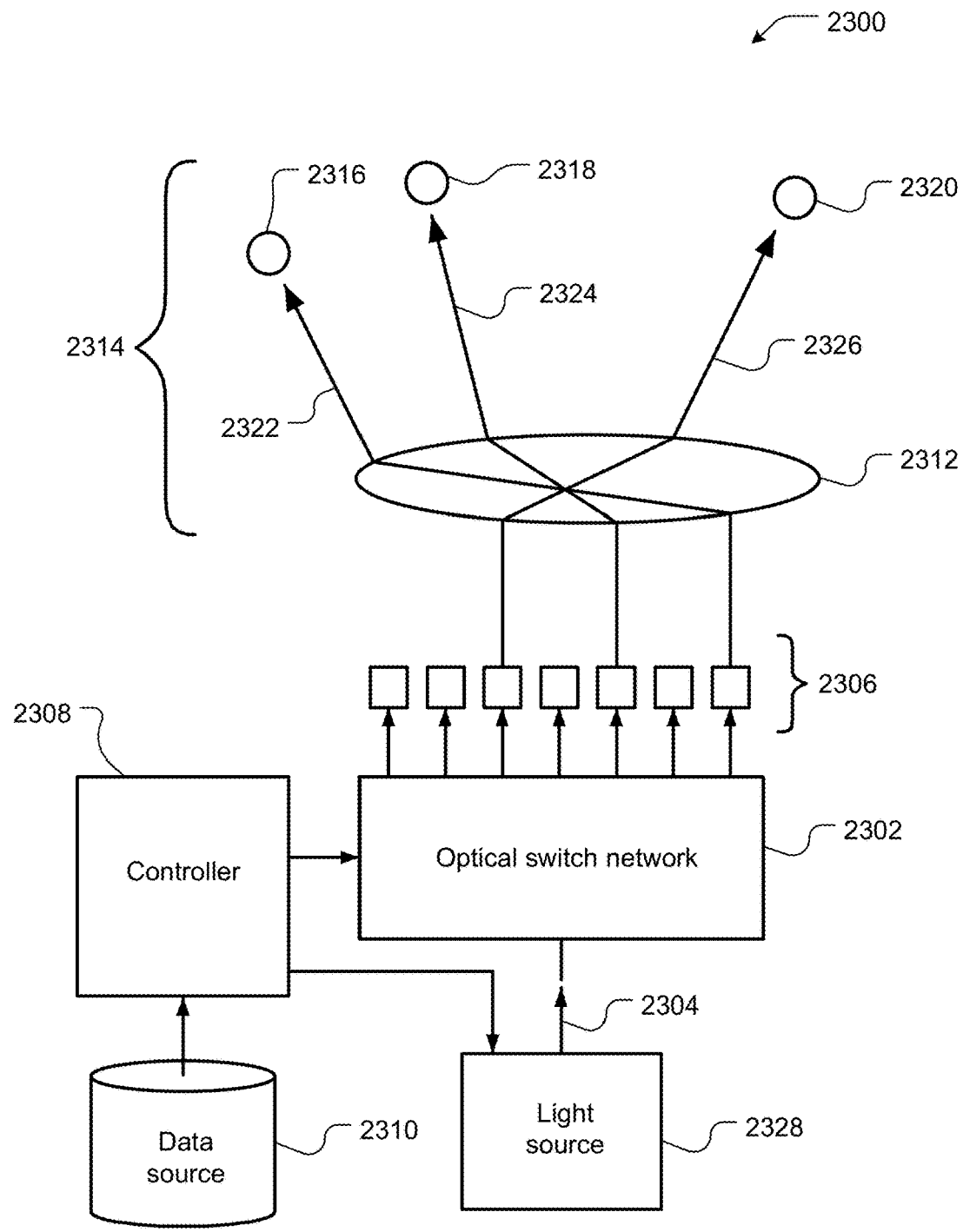
FIG. 23 is a schematic diagram of a display projector capable of projecting an image that is perceived differently by viewers observing the projection from different angles, according to an embodiment of the present invention.

FIG. 23 is a schematic diagram of a display projector 2300 capable of projecting an image that is perceived differently by viewers observing the projection from different angles. An optical switch network 2302, such as any of the optical switch networks described herein, receives light via an optical input 2304, such as from a modulated laser (not shown), and routes the light to an output port of a plurality of output ports 2306, as directed by a controller 2308. Each output port 2306 may be an optical coupler, such as described herein. The controller may use data from a data source 2310 to command the optical switch network 2302. The data source 2310 may contain predefined data or the data may be generated in real time. The data source 2310 may contain data defining, for example, a 3-dimensional representation of an object.

A lenticular lens 2312 optically couples the output ports 2306 to free space 2314. Due to the nature of the lenticular lens 2312, each observation angle, represented by observers 2316, 2318 and 2320, sees a different portion of the output ports 2306. Specifically, each observer 2316-2320 sees a different output port of the output ports 2306, as indicated by lines 2322, 2324 and 2326.

The display projector 2300 may project one pixel of an image, and each observer 2300 may see that pixel differently, based on the observer's position, relative to the lenticular lens 2312. For example, the pixel may represent a portion of a flower. That portion of the flower would appear different to different observers observing the flower from different locations. For example, if the portion of the flower is illuminated, and an observer's line of sight to the portion of the flower is not blocked, the observer would see the portion of the flower. However, if the observer's line of sight is blocked, the portion of the flower would be invisible. Similarly, the portion of the flower may appear elongated or compressed, depending on the angle of observation. Thus, depending on the observer's angle, a given pixel may be bright, dim or blank (invisible).

Figure 24:
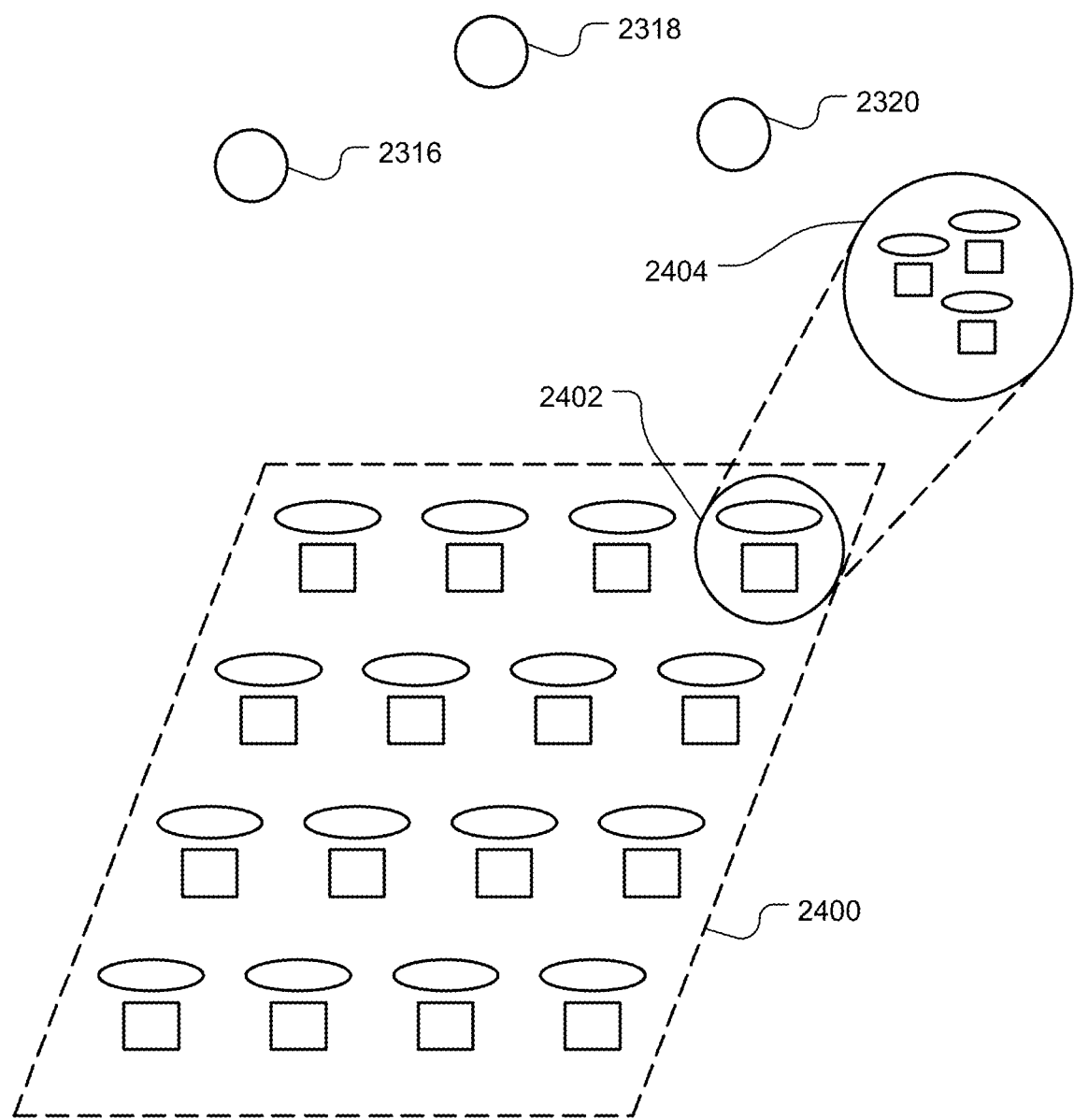
FIG. 24 is a schematic diagram of a set of the display projectors of FIG. 23, according to an embodiment of the present invention.

To project a multi-pixel image, including an apparently 3-dimensional image, to the observers 2316-2320, the display projector 2300 may include a set 2400 of optical switch networks, output ports and lenticular lens, one optical switch network, one output port and one lenticular lens for each pixel to be projected, as schematically illustrated in FIG. 24. Thus, from the point of view of the observers 2316-2320, the respective pixels represented by the set 2400 of optical switch networks, output ports and lenticular arrays are tiled to form a multi-pixel image.

Each optical switch network, output port and lenticular array group, represented by group 2402, may project a single color, such as white or red, to form a monochrome image. Alternatively, each group 2402 may include three optical switch networks, three output ports and three lenticular lenses, as shown at 2404, where each optical switch network, output port and lenticular lens projects a different color, such as red, green and blue.

Returning to FIG. 23, the controller 2308 may scan through the output ports 2306, i.e., through the possible view angles, to project a different amplitude and/or color for each view angle. The controller 2308 may modulate a light source 2328 to control the amplitude and/or color of the input light 2304. If the light source 2328 is capable of projecting red, green and blue, or another suitable range of colors, the controller 2308 may cycle through the colors for each output port 2306 and thereby project a color image to the observers 2316-2320. In any case, the scanning should be done quickly enough that the observers 2316-2320 do not perceive flicker.

Although the display projector 2300 is described as having a separate lenticular lens for each pixel, a single lenticular lens may be large enough to project several pixels, such as all or some of the pixels in a given column. A lenslet array of lenticular lenses may be used.

Figure 25:
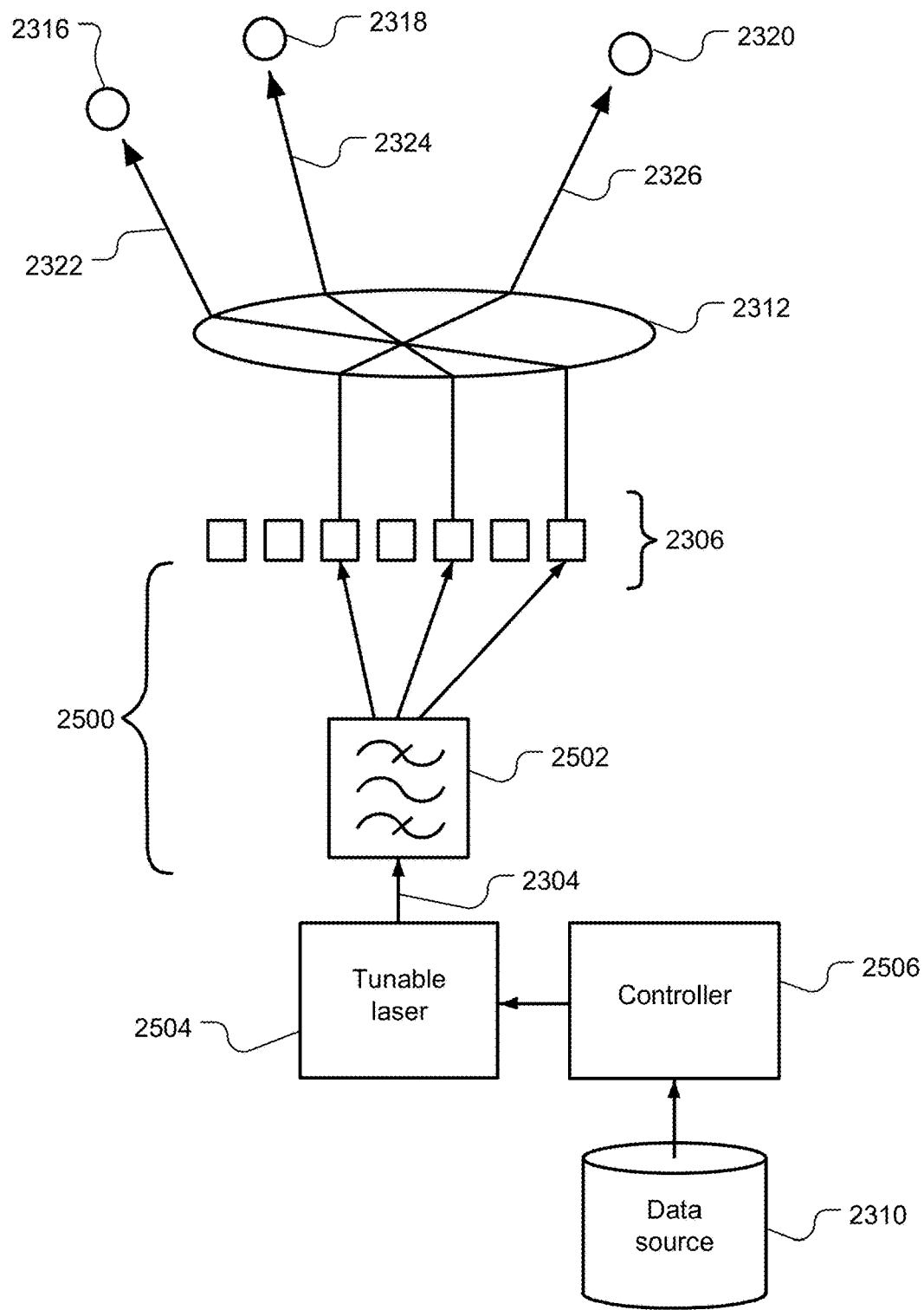
FIG. 25 is a schematic illustration of another embodiment of an optical switch network, according to an embodiment of the present invention.

FIG. 25 is a schematic illustration of another embodiment of an optical switch network 2500, according to an embodiment of the present invention. The optical switch network 2500 includes a wavelength filter 2502, such as a prism. Depending on the wavelength of the input light 2304, the wavelength filter 2502 directs the light to one of the output ports 2306. The source of the input light 2304 may be, for example, a tunable laser 2504, and a controller 2506 may control the wavelength of the tunable laser 2504, based on information from the data source 2310, to select which output port 2306 is to project light. As with the embodiment discussed with respect to FIG. 23, the controller 2506 may scan through the wavelengths and modulate the amplitude of the tunable laser 2504 to affect the amplitude of the pixel projected at each angle, i.e. to the observers 2316-2320.

In some embodiments, the output ports 2306 pass the wavelength of light they receive. In other embodiments, the output ports 2306 are configured to be stimulated by the incoming light, regardless of wavelength, and emit a predetermined wavelength of light, such as red, green or blue.

If the range of wavelengths in the input light 2304 and pass band of wavelength filter 2502 are relatively narrow, so the light 2304 would be perceived by a human observer 2316-2320 as a single color or nearly a single color, optical switch network 2500 may be used to project monochrome pixels. If color pixels are to be projected, the scheme described with respect to FIG. 25 may be replicated for each pixel, and each replica may project a different color, such as red, green and blue, as discussed with respect to group 2404 (FIG. 24). In each of the replicas, the wavelength filter 2502 is different, so as to enable three suitable different colors, such as red, green and blue, to reach a given output port 2306 in each replica, where the three colors can be used in combination to be perceived by a human observer 2316-2320 as a given color.

For example, the wavelength filter 2502 in one of three replicas may be configured such that red light reaches a given output port 2306 in the replica, the wavelength filter 2502 in a second of the three replicas may be configured such that green light reaches the corresponding, i.e., same output direction, output port 2306 in the second replica, and the wavelength filter 2502 in a third of the three replicas may be configured such that blue light reaches the corresponding, i.e., same output direction, output port 2306 in the third replica.

On the other hand, if the range of wavelengths in the input light 2304 and pass band of wavelength filter 2502 are relatively wide, so the light 2304 would be perceived by a human observer 2316-2320 as having different colors, the scheme described with respect to FIG. 25 may be replicated for each pixel, as discussed above. In each of the replicas, the wavelength filter 2502 is different, so as to enable three suitable different colors, such as red, green and blue, to reach a given output port 2306 in each replica, where the three colors can be used in combination to be perceived by a human observer 2316-2320 as a given color. For example, the wavelength filter 2502 in one of three replicas may be configured such that red light reaches a given output port 2306 in the replica, the wavelength filter 2502 in a second of the three replicas may be configured such that yellow light reaches the corresponding, i.e., same output direction, output port 2306 in the second replica, and the wavelength filter 2502 in a third of the three replicas may be configured such that orange light reaches the corresponding, i.e., same output direction, output port 2306 in the third replica. However, this scheme may limit the range or number of colors that are projectable to each observer 2316-2320.

Although the display projector 2300 and the optical switch network 2500 have been described in the context of outputting optical signals, the observers 2316-2320 may be replaced by optical sources, such as light reflected from objects, and the light source 2328 and the tunable laser 2504 may be replaced by suitable optical receivers to form receive terminals.

As used herein, "optical coupler" means an optical antenna or other interface device between optical signals traveling in free space and optical signals traveling in a waveguide, such as an optical fiber or solid glass. In some embodiments, ports 200 discussed with reference to FIGS. 2 and 12 may be implemented with optical couplers. In embodiments where optical waveguides extend perpendicular to a desired direction of free-space propagation, an optical coupler should facilitate this change of direction. Examples of optical couplers include compact gratings, prisms fabricated in waveguides and facets etched in wafers and used as mirrors. An optical antenna is a device designed to efficiently convert free-propagating optical radiation to localized energy, and vice versa. Optical antennas are described by Palash Bharadwaj, et al., "Optical Antennas," Advances in Optics and Photonics 1.3 (2009), pp. 438-483, the entire contents of which are hereby incorporated by reference herein, for all purposes.

In some embodiments, the optical switch network 104 or 1200 may be implemented on a photonic chip, such as a silicon wafer. "Wafer" means a manufactured substrate, such as a silicon wafer. The surface of the earth, for example, does not fall within the meaning of wafer. The photonic chip provides a substrate, and the photonic chip may be fabricated to provide optical waveguides within a thickness of the substrate. The optical waveguides may be made of glass or another material that is optically transparent at wavelengths of interest. The optical waveguides may be solid or they may be hollow, such as a hollow defined by a bore in the thickness of the substrate, and partially evacuated or filled with gas, such as air or dry nitrogen. The optical waveguides may be defined by a difference in refractive index of the optical medium of the waveguides and refractive index of the substrate or other material surrounding the optical waveguides. The photonic chip may be fabricated using conventional semiconductor fabrication processes, such as the conventional CMOS process.

Depending on wavelength at which operation of the optical switch network 104 or 1200 is desired, an appropriate material should be used. For example, passive waveguides can be made of a variety of well-known materials, preferably silicon nitride, because of its compatibility with CMOS fabrication processes and high index contrast. Alternative materials for passive waveguides include doped silica or polymers. Active materials include GaN, AlN, and certain polymers.

As used herein, "light" means electromagnetic radiation having a wavelength between about 100 nm and about 1 mm.

While the invention is described through the above-described exemplary embodiments, modifications to, and variations of, the illustrated embodiments may be made without departing from the inventive concepts disclosed herein. For example, although specific parameter values, such as dimensions and materials, may be recited in relation to disclosed embodiments, within the scope of the invention, the values of all parameters may vary over wide ranges to suit different applications. Unless otherwise indicated in context, or would be understood by one of ordinary skill in the art, terms such as "about" mean within ±20%.

As used herein, including in the claims, the term "and/or," used in connection with a list of items, including in the claims, means one or more of the items in the list, i.e., at least one of the items in the list, but not necessarily all the items in the list. As used herein, including in the claims, the term "or," used in connection with a list of items, means one or more of the items in the list, i.e., at least one of the items in the list, but not necessarily all the items in the list. "Or" does not mean "exclusive or."

As used herein, including in the claims, an element described as being configured to perform an operation "or" another operation is met by an element that is configured to perform only one of the operations. That is, the element need not be configured operate in one mode in which it performs one of the operations, and in another mode in which it performs the other operation. The element may, but need not, be configured to perform more than one of the operations.

Although aspects of embodiments may be described with reference to block diagrams, functions, operations, decisions, etc. of all or a portion of each block, or a combination of blocks, may be combined, separated into separate operations or performed in other orders. All or a portion of each block or combination thereof may be implemented as computer program instructions (such as software), hardware (such as combinatorial logic, Application Specific Integrated Circuits (ASICs), Field-Programmable Gate Arrays (FPGAs), processor or other hardware), firmware or combinations thereof. For example, selecting a direction in which to transmit or receive light by a transmit/receive terminal 100, including selecting one or more binary optical switches to activate and/or to command to direct light in a particular direction, such as via the described row-and-column matrix, may be performed by a processor executing instructions stored in a memory.

Embodiments, or portions thereof, may be implemented by one or more processors executing, or controlled by, instructions stored in a memory. Each processor may be a general purpose processor, such as a central processing unit (CPU), a graphic processing unit (GPU), digital signal processor (DSP), a special purpose processor, etc., as appropriate, or combination thereof.

The memory may be random access memory (RAM), read-only memory (ROM), flash memory or any other memory, or combination thereof, suitable for storing control software or other instructions and data. Instructions defining the functions of the present invention may be delivered to a processor in many forms, including, but not limited to, information permanently stored on tangible non-writable storage media (e.g., read-only memory devices within a computer, such as ROM, or devices readable by a computer I/O attachment, such as CD-ROM or DVD disks), information alterably stored on tangible writable storage media (e.g., floppy disks, removable flash memory and hard drives) or information conveyed to a computer through a communication medium, including wired or wireless computer networks. Moreover, while embodiments may be described in connection with various illustrative data structures, systems may be embodied using a variety of data structures.

Disclosed aspects, or portions thereof, may be combined in ways not listed above and/or not explicitly claimed. In addition, embodiments disclosed herein may be suitably practiced, absent any element that is not specifically disclosed herein. Accordingly, the invention should not be viewed as being limited to the disclosed embodiments.

What is claimed is:

1. An optical switch network, comprising:
   a common input/output port;
   a plurality of N other ports;
   a first waveguide optically coupled to the common input/output port;
   a plurality of first binary optical switches optically coupled to the first waveguide, the plurality of first binary optical switches being disposed along the length of the first waveguide; and
   a plurality of second waveguides, each second waveguide of the plurality of second waveguides being optically coupled to the first waveguide via a respective first binary optical switch of the plurality of first binary optical switches;
   for each second waveguide of the plurality of second waveguides, a respective plurality of second binary optical switches optically coupled to the second waveguide of the plurality of second waveguides, each plurality of second binary optical switches being disposed along the length of the respective second waveguide, wherein each second binary optical switch of the plurality of second binary optical switches is optically coupled between the respective second waveguide of the plurality of second waveguides and a respective port of the plurality of N other ports and comprises:
     a translatable optical grating configured to translate between at least two positions, a first position of the at least two positions being sufficiently close to the respective second waveguide to optically couple with the second waveguide with a coupling efficiency of at least about 25%, and a second position of the at least two positions being sufficiently far from the respective second waveguide to optically couple with the second waveguide with a coupling efficiency of at most about 5%; and
     a MEMS structure configured to selectively translate the translatable optical grating to the first position and to the second position:
   wherein each second binary optical switch of the plurality of second binary optical switches is configured, when the second binary optical switch is in the first position, to optically couple between the respective second waveguide and free space beyond the planar surface.

2. The optical switch network of claim 1, wherein the N other ports are arranged in a rectangular array.

3. The optical switch network of claim 1, wherein the N other ports are disposed on a planar surface.

4. The optical switch network of claim 1, further comprising:
   a row-and-column addressing matrix having a plurality of rows and a plurality of columns; wherein:
   each first binary optical switch of the plurality of first binary optical switches and each second binary optical switch of the plurality of second binary optical switches is:
     coupled to a row of the plurality of rows;
     coupled to a column of the plurality of columns; and
     configured to actuate in response to signals being present on both the row of the plurality of rows and the column of the plurality of columns.

5. The optical switch network of claim 1, wherein the optical switch network comprises a photonic chip.

6. The optical switch network of claim 1, wherein each port of the N other ports comprises an optical coupler.

7. An optical send/receive terminal, comprising:
   a lens having a field of view;
   an optical switch network, the optical switch network comprising:
   a common input/output port;
   a plurality of N other ports optically coupled to the lens, such that each port of the plurality of N other ports is optically coupled to a unique portion of the lens field of view;
   a first waveguide optically coupled to the common input/output port;
   a plurality of first binary optical switches optically coupled to the first waveguide, the plurality of first binary optical switches being disposed along the length of the first waveguide;
   a plurality of second waveguides, each second waveguide of the plurality of second waveguides being optically coupled to the first waveguide via a respective first binary optical switch of the plurality of first binary optical switches;
   for each second waveguide of the plurality of second waveguides, a respective plurality of second binary optical switches optically coupled to the second waveguide of the plurality of second waveguides, each plurality of second binary optical switches being disposed along the length of the respective second waveguide, wherein each second binary optical switch of the plurality of second binary optical switches is optically coupled between the respective second waveguide of the plurality of second waveguides and a respective port of the plurality of N other ports and comprises:
   a translatable optical grating configured to translate between at least two positions, a first position of the at least two positions being sufficiently close to the respective second waveguide to optically couple with the second waveguide with a coupling efficiency of at least about 25%, and a second position of the at least two positions being sufficiently far from the respective second waveguide to optically couple with the second waveguide with a coupling efficiency of at most about 5%; and
   a MEMS structure configured to selectively translate the translatable optical grating to the first position and to the second position; and
   an optical transmitter and/or an optical receiver optically coupled to the common input/output port of the optical switch network;
   wherein the optical switch network defines a surface and each second binary optical switch of the plurality of second binary optical switches is configured, when the second binary optical switch is in the first position, to optically couple between the respective second waveguide and free space beyond the surface of the optical switch network.

8. The optical send/receive terminal of claim 7, further comprising a plurality of optical fibers optically coupling the N other ports to the lens.

9. The optical send/receive terminal of claim 7, wherein each translatable optical grating comprises a respective MEMS structure.

10. The optical send/receive terminal of claim 7, wherein each first binary optical switch of the plurality of first binary optical switches comprises a respective MEMS structure.

11. The optical send/receive terminal of claim 7, further comprising:
   a row-and-column addressing matrix having a plurality of rows and a plurality of columns; wherein:
   each first binary optical switch of the plurality of first binary optical switches and each second binary optical switch of the plurality of second binary optical switches is:
   coupled to a row of the plurality of rows;
   coupled to a column of the plurality of columns; and
   configured to actuate in response to signals being present on both the row of the plurality of rows and the column of the plurality of columns.

12. An optical terminal, comprising:
a lens having a field of view;
and a planar optical switch that defines a plane and comprising a plurality of optical switch arrays, each optical switch array of the plurality of optical switch arrays comprising:
   a common port;
   a plurality of N other ports optically coupled, via free space beyond the plane of the planar optical switch, to the lens, such that each port of the plurality of N other ports is optically coupled to a unique portion of the lens field of view;
   a planar N×1 optical switch network optically coupled between the common port and the plurality of N other ports; and
   an optical receiver optically coupled to the common port.

13. The optical terminal of claim 12, wherein each optical switch array of the plurality of optical switch arrays further comprises an optical transmitter optically coupled to the common port.

14. The optical terminal of claim 12, further comprising an optical transmitter optically coupled to the common port of at least one optical switch array of the plurality of optical switch arrays.

15. The optical terminal of claim 12, further comprising an optical transmitter optically coupled to the common ports of the plurality of optical switch arrays.

16. The optical terminal of claim 12, wherein:
for each optical switch array of the plurality of optical switch arrays, the planar N×1 optical switch network comprises:
   a waveguide having a length and being optically coupled to the common port of the optical switch array; and
   a plurality of binary optical switches disposed on the plane of the planar optical switch, the plurality of binary optical switches being disposed along the length of the waveguide, each binary optical switch of the plurality of binary optical switches comprising:
      a translatable optical grating configured to translate between at least two positions, a first position of the at least two positions being sufficiently close to the waveguide to optically couple between the waveguide and the free space beyond the plane of the planar optical switch with a coupling efficiency of at least about 25%, and a second position of the at least two positions being sufficiently far from the waveguide to optically couple between the waveguide and the free space with a coupling efficiency of at most about 5%; and
      a MEMS structure configured to selectively translate the translatable optical grating to the first position and to the second position.

17. An optical terminal, comprising:
a lens having a field of view; and
a planar optical switch defining a planar surface and comprising a plurality of optical switch arrays, each optical switch array of the plurality of optical switch arrays comprising:
   a common port;
   a waveguide having a length and being optically coupled to the common port; and
   a plurality of binary optical switches disposed on the planar surface, the plurality of binary optical switches being disposed along the length of the waveguide, each binary optical switch of the plurality of binary optical switches comprising:
      a translatable optical grating configured to translate between at least two positions, a first position of the at least two positions being sufficiently close to the waveguide to optically couple between the waveguide and free space beyond the planar surface with a coupling efficiency of at least about 25%, and a second position of the at least two positions being sufficiently far from the waveguide to optically couple between the waveguide and the free space with a coupling efficiency of at most about 5%; and
      a MEMS structure configured to selectively translate the translatable optical grating to the first position and to the second position.

18. An optical system, comprising:
a lenticular lens having a field of view;
a plurality of ports disposed such that, for each port of the plurality of ports, a unique portion of the field of view is subtended, through the lenticular lens, by the port; and
an optical switch network having an input port and configured to optically couple the input port to a selected port of the plurality of ports in response to a control signal;
wherein the optical switch network defines a planar surface and comprises:
a waveguide having a length and being optically coupled to the input port;
and a plurality of binary optical switches disposed on the planar surface, the plurality of binary optical switch being disposed along the length of the waveguide, each binary optical switch of the plurality of binary optical switches comprising:
a translatable optical grating configured to translate between at least two positions, a first position of the at least two positions being sufficiently close to the waveguide to optically couple between the waveguide and free space beyond the planar surface with a coupling efficiency of at least about 25%, and a second position of the at least two positions being sufficiently far from the waveguide to optically couple between the waveguide and the free space with a coupling efficiency of at most about 5%; and
a MEMS structure configured to selectively translate the translatable optical grating to the first position and to the second position.

19. The optical system of claim 18, wherein the optical switch network comprises:
a wavelength filter; and
a wavelength tunable light source.

* * * * *